(12) United States Patent
Ueda

(10) Patent No.: US 7,928,445 B2
(45) Date of Patent: Apr. 19, 2011

(54) SEMICONDUCTOR MOS TRANSISTOR DEVICE

(75) Inventor: Naohiro Ueda, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 158 days.

(21) Appl. No.: 12/300,347

(22) PCT Filed: Mar. 11, 2008

(86) PCT No.: PCT/JP2008/055015
§ 371 (c)(1),
(2), (4) Date: Nov. 11, 2008

(87) PCT Pub. No.: WO2008/123080
PCT Pub. Date: Oct. 16, 2008

(65) Prior Publication Data
US 2009/0309146 A1 Dec. 17, 2009

(30) Foreign Application Priority Data
Mar. 28, 2007 (JP) ................................. 2007-085868

(51) Int. Cl.
H01L 29/786 (2006.01)
(52) U.S. Cl. ............ 257/72; 257/69; 257/270; 257/350; 257/E21.412; 257/E29.147
(58) Field of Classification Search .................. 438/217, 438/289; 257/E21.634, E21.639, E21.644
See application file for complete search history.

(56) References Cited

U.S. PATENT DOCUMENTS

| | | | | |
|---|---|---|---|---|
| 5,818,070 A | * | 10/1998 | Yamazaki et al. | ............... 257/72 |
| 5,998,842 A | | 12/1999 | Sano | |
| 6,306,700 B1 | * | 10/2001 | Yang | .............................. 438/217 |
| 2003/0030105 A1 | | 2/2003 | Nishibe et al. | |
| 2004/0140487 A1 | | 7/2004 | Furumiya et al. | |

FOREIGN PATENT DOCUMENTS

| | | |
|---|---|---|
| JP | 53-122374 | 10/1978 |
| JP | 5-55462 | 3/1993 |
| JP | 9-97906 | 4/1997 |
| JP | 9-266255 | 10/1997 |
| JP | 10-209308 | 8/1998 |
| JP | 11-68070 | 3/1999 |
| JP | 3275569 | 2/2002 |
| JP | 2003-60197 | 2/2003 |
| JP | 2005-303037 | 10/2005 |
| JP | 2007-13211 | 1/2007 |
| JP | 2007-53316 | 3/2007 |

* cited by examiner

Primary Examiner — Zandra Smith
Assistant Examiner — Tsz K Chiu
(74) Attorney, Agent, or Firm — Cooper & Dunham LLP

(57) ABSTRACT

A disclosed semiconductor device includes a MOS transistor that causes no problems concerning the formation of a thick gate insulating film and that is applicable to high withstand voltage devices. A drain region has a double diffusion structure including an N-drain region 3d and an N+ drain region 11d. A gate electrode includes a first gate electrode 9 formed on an insulating film 7 and a second gate electrode 13 formed on the first gate electrode 9 via a gate electrode insulating film 11. Between the gate insulating film 7 and the N+ source region 11s, a field insulating film 15 is disposed, over which an edge of the first gate electrode 9 is disposed. A gate voltage applied to the second gate electrode 13 via a gate wiring 13g is divided between the gate insulating film 7 and the gate electrode insulating film 11.

13 Claims, 41 Drawing Sheets

US 7,928,445 B2

SEMICONDUCTOR MOS TRANSISTOR DEVICE

TECHNICAL FIELD

The present invention relates to a semiconductor device comprising a MOS transistor, the MOS transistor having a drain region and a source region, both of a second conductivity type, disposed spaced apart from each other on a surface of a semiconductor substrate of a first conductivity type, a gate insulating film formed on the semiconductor substrate between the source region and the drain region, and a gate electrode formed on the gate insulating film, wherein the semiconductor substrate between the source region and the drain region provides a channel region. In particular, the invention relates to LOCOS offset transistors.

BACKGROUND ART

As the markets for cell phones and portable gaming machines have grown, there is a growing need for liquid crystal driving circuits. To drive liquid crystal requires high voltages for back-lighting power supply purposes, for example. Consequently, LSI implementation of liquid crystal driving circuitry requires a high withstand voltage transistor. Typical examples of high withstand voltage transistors of the CMOS (Complementary Metal Oxide Semiconductor) type include a LOCOS (LOCal Oxidation of Silicon) offset transistor (see, e.g., Patent Document 1) comprising a MOS transistor, and a masked-LDD (Lightly Doped Drain) transistor (see, e.g., Patent Document 2).

The LOCOS offset transistor is described below.

FIG. 32 shows a cross section of a conventional LOCOS offset transistor.

On a surface of a P-type semiconductor substrate 1, an N-drain region 3d and an N-source region 3s are formed spaced apart from each other. The semiconductor substrate 1 between the N-drain region 3d and the N-source region 3s provides a channel region 5. On the semiconductor substrate 1 between the N-drain region 3d and the N-source region 3s, a gate insulating film 51 is formed. On top of the gate insulating film 51, a gate electrode 53 is formed. While not shown in the drawing, in the regions of the semiconductor substrate 1 where the N-drain region 3d, the N-source region 3s, and the channel region 5 are formed, a P-type well region is formed.

On the surface side of the N-drain region 3d, an N+ drain region 11d is formed spaced apart from the edges of the N-drain region 3d. On the surface side of the N-source region 3s, an N+ source region 11s is formed spaced apart from the edges of the N-source region 3s.

On the surface of the semiconductor substrate 1, LOCOS oxide films 15 are formed for defining a region for the formation of a LOCOS offset transistor. The LOCOS oxide films 15 have a film thickness greater than the gate insulating film 51. The LOCOS oxide films 15 are also formed on the surface of the N-drain region 3d between an edge of the N-drain region 3d on the side of the channel region 5 and the N+ drain region 11d, and on the surface of the N-source region 3s between an edge of the N-source region 3s on the side of the channel region 5 and the N+ source region 11s. The edges of the gate electrode 53 are disposed over the LOCOS oxide films 15.

On the semiconductor substrate 1, a silicon oxide insulating film 17 is formed covering the gate electrode 53, the N+ drain region 11d, the N+ source region 11s, and the LOCOS oxide films 15. On the silicon oxide insulating film 17, a gate wiring 19g, a drain wiring 19d, and a source wiring 19s are formed of a metal material. Via connection holes 21 formed in the silicon oxide insulating film 17, the gate wiring 19g is connected to the gate electrode 53; the drain wiring 19d is connected to the N+ drain region 11d; and the source wiring 19s is connected to the N+ source region 11s.

With reference to FIGS. 32 through 37, a process of manufacturing the conventional LOCOS offset transistor is described.

After forming the P-type well region, which is not shown, in the P-type semiconductor substrate 1, a resist pattern (not shown) is formed by a photomechanical technique. Using the pattern as a mask, phosphorus is ion-implanted under the conditions of an implantation energy of 100 KeV and a dose of $2.0 \times 10^{13}$ cm$^2$. The resist pattern is thereafter removed and the substrate is exposed to a nitrogen atmosphere at 1000° C. for 30 minutes, whereby the implanted phosphorus is diffused and activated, forming the N-drain region 3d and the N-source region 3s of low concentration (see FIG. 33).

Using an existing isolation formation technique, the LOCOS oxide films 15 are formed to a film thickness of 500 nm (see FIG. 34).

After the gate insulating film 51 is formed to a film thickness of 80 nm, a polycrystalline silicon film is successively deposited to a thickness of 300 nm. Then, a resist pattern is formed using a photomechanical technique. Using the resist pattern as a mask, the polycrystalline silicon film and the gate insulating film 51 are sequentially removed by etching, whereby the gate electrode 53 is formed of the polycrystalline silicon film and the gate insulating film 51 is formed under the gate electrode 53. Thereafter, the resist pattern is removed (see FIG. 35). The edges of the gate electrode 53 are disposed on the LOCOS oxide films 15.

After a resist pattern having openings in regions for forming the LOCOS offset transistor is formed, arsenic is ion-implanted under the conditions of an implantation energy of 30 KeV and a dose of $5.0 \times 10^{15}$ cm$^{-2}$. The resist pattern is then removed and the substrate is exposed to a nitrogen atmosphere at 900° C. for 30 minutes, whereby the implanted arsenic is diffused and activated, forming the N+ drain region 11d and the N+ source region 11s, both of high concentration (see FIG. 36). The N+ drain region 11d and the low-concentration N-drain region 3d that covers around it constitute the drain region, while the N+ source region 11s and the low concentration N– source region 3s that covers around it constitute the source region. Thus, in the LOCOS offset transistor, the drain region and the source region have a double diffusion structure.

Over the entire surface of the semiconductor substrate 1, a silicon oxide insulating film 17 is deposited to a film thickness of 1000 nm. After a resist pattern is formed, predetermined locations of the silicon oxide insulating film 17 are removed by etching using the resist pattern as a mask, whereby connection holes 21 are formed at locations corresponding to the N+ drain region 11d, the N+ source region 11s, and the gate electrode 53 (see FIG. 37).

Over the silicon oxide insulating film 17, an aluminum metal film is formed and then patterned to form the gate wiring 19g, the drain wiring 19d, and the source wiring 19s (see FIG. 32).

The LOCOS offset transistor thus have the features that (1) the drain region and the source region have a double diffusion structure; and (2) the edges of the gate electrode 53 are disposed over the LOCOS oxide films 15 that are thicker than the gate insulating film 51. Due to these two features, a high voltage LOCOS offset transistor can be obtained.

The withstand voltage of the drain region and the source region is determined by avalanche breakdown. As shown in FIG. 32, in the LOCOS offset transistor, the N+ drain region 11d is surrounded by the N-drain region 3d and the N+ source region 11s is surrounded by the N-source region 3s. Thus, the N+ drain region 11d and the N+ source region 11s, which have high concentrations, are not in direct contact with the P-type well. As a result, the avalanche breakdown voltage of the drain region and the source region can be increased up to about 30 V. The avalanche breakdown voltage of the drain region and the source region of a conventional MOS transistor that does not have the above two features (1) and (2) of the LOCOS offset transistor is on the order of 10 V.

It is known that in a MOS transistor, when the potential of its gate electrode is fixed to GND (ground) potential, the withstand voltage of the PN junction immediately below the gate electrode decreases. This phenomenon is referred to as the gate modulated junction withstand voltage, whereby a conventional MOS transistor breaks down at a voltage as low as 10 V. On the other hand, in the LOCOS offset transistor, since the edges of the gate electrode 53 overlie the LOCOS oxide films 15, as shown in FIG. 32, the distance between the gate electrode 53 and the high-concentration N+ regions 11d and 11s in a direction perpendicular to the substrate can be increased. As a result, the gate-modulated junction breakdown voltage can be increased up to about 30 V.

Thus, an increase in the withstand voltage can be achieved by adopting the aforementioned two structural features; i.e., (1) the drain region and the source region are formed of the high-concentration N+ regions 11d, 11s and the low-concentration N− regions 3d, 3s, respectively; and (2) the edges of the gate electrode 53 are disposed over the LOCOS oxide films 15.

In the following, a masked-LDD transistor is described.

FIG. 38 shows a cross section of a masked-LDD transistor.

On the surface of a P-type semiconductor substrate 1, an N-drain region 3d and an N-source region 3s are formed spaced apart from each other. On the semiconductor substrate 1 between the N-drain region 3d and the N-source region 3s, a gate insulating film 51 is formed. Over the gate insulating film 51, a gate electrode 53 is formed. The semiconductor substrate 1 between the N-drain region 3d and the N-source region 3s provides a channel region 5. While not shown in the drawing, in the regions of the semiconductor substrate 1 where the N-drain region 3d, the N-source region 3s, and the channel region 5 are formed, a P-type well region is formed.

On the surface of the N-drain region 3d, an N+ drain region 11d is formed spaced apart from the edges of the N-drain region 3d. On the surface of the N-source region 3s, an N+ source region 11s is formed spaced apart from the edges of the N-source region 3s. Thus, as seen from above, the N+ drain region 11d and the N+ source region 11s are disposed spaced apart from the gate electrode 53.

On the surface of the semiconductor substrate 1, LOCOS oxide films 15 are formed for defining a region for the formation of the masked-LDD transistor. The LOCOS oxide films 15 have a film thickness greater than the gate insulating film 51. Within the region for forming the masked-LDD transistor, the LOCOS oxide films 15 are not formed.

A silicon oxide insulating film 17 is formed on the semiconductor substrate 1 in such a manner as to cover the gate electrode 53, the N+ drain region 11d, the N+ source region 11s, and the LOCOS oxide films 15. On the silicon oxide insulating film 17, a gate wiring 19g, a drain wiring 19d, and a source wiring 19s of a metal material are formed. Via connection holes 21 formed in the silicon oxide insulating film 17, the gate wiring 19g is connected to the gate electrode 53; the drain wiring 19d is connected to the N+ drain region 11d; and the source wiring 19s is connected to the N+ source region 11s.

With reference to FIGS. 38 to 43, a manufacturing process for the masked-LDD transistor is described. After the P-type well region (not shown) is formed in the P-type semiconductor substrate 1, the LOCOS oxide films 15 are formed to a film thickness of 500 nm by an existing isolation formation technique (see FIG. 39).

After the gate insulating film 51 is formed to a film thickness of 80 nm, a polycrystalline silicon film is successively deposited to a thickness of 300 nm. Then, a resist pattern is formed by a photomechanical technique and, using it as a mask, the polycrystalline silicon film and the gate insulating film 51 are sequentially removed by etching, thereby forming the gate electrode 53 of the polycrystalline silicon film and the gate insulating film 51 under the gate electrode 53. Thereafter, the resist pattern is removed (see FIG. 40).

After a resist pattern having openings at regions for forming the masked-LDD transistor is formed, phosphorus is ion-implanted under the conditions of an implantation energy of 30 KeV and a dose of $2.0 \times 10^{13}$ cm$^{-2}$. The resist pattern is then removed and the substrate is exposed to a nitrogen atmosphere at 900° C. for 30 minutes, whereby the implanted phosphorus is diffused and activated, forming the N-drain region 3d and the N-source region 3s of low concentration (see FIG. 41).

A resist pattern is then formed which covers the gate electrode 53 and portions of the N− drain region 3d and the N-source region 3s that are, as seen from above, adjacent to the gate electrode 53. Using that resist pattern as a mask, arsenic is ion-implanted under the conditions of an energy of 30 KeV and a dose of $5.0 \times 10^{15}$ cm$^{-2}$. After the resist pattern is removed, the substrate is exposed to a nitrogen atmosphere at 900° C. for 30 minutes, whereby the implanted arsenic is diffused and activated, forming the N+ drain region 11d and the N+ source region 11s of high concentration (see FIG. 42). The N+ drain region 11d and the low-concentration N-drain region 3d that surrounds it constitute the drain region, while the N+ source region 11s and the low-concentration N-source region 3s that surrounds it constitute the source region. Thus, in the masked-LDD transistor, the drain region and the source region have a double diffusion structure.

Thus, the masked-LDD transistor is characterized by the absence of the LOCOS oxide films 15 between the gate electrode 53 and the N-drain region 3d and the N-source region 3s. As will be understood from the above-described manufacturing process, the regions for the N-drain region 3d and the N-source region 3s are defined by resist patterns. A MOS transistor of this structure is formed by partially masking the implantation of high-concentration arsenic with such resist patterns; hence the name "masked-LDD" transistor.

To continue with the description of the manufacturing process, over the entire surface of the semiconductor substrate 1, a silicon oxide insulating film 17 is formed to a film thickness of 1000 nm. After a resist pattern is formed, predetermined locations of the silicon oxide insulating film 17 are removed by etching using the resist pattern as a mask, whereby connection holes 21 are formed at positions corresponding to the N+ drain region 11d, the N+ source region 11s, and the gate electrode 53 (see FIG. 43).

Over the silicon oxide insulating film 17, an aluminum metal film is formed and then patterned, whereby the gate wiring 19g, the drain wiring 19d, and the source wiring 19s are formed (see FIG. 38).

The masked-LDD transistor differs from the LOCOS offset transistor in that the edges of the gate electrode on the sides of the drain region and the source region do not overlie the LOCOS oxide film. In a reflection of this difference, the applicable voltage ("withstand voltage") of the masked-LDD transistor is smaller than that of the LOCOS offset transistor. On the other hand, the current driving capacity is higher for the masked-LDD transistor. Namely, the masked-LDD transistor is suitable for applications that need to permit the flow of large currents with an intermediate level of withstand voltage, and the LOCOS offset transistor is suitable for applications that need to handle high voltages even at the expense of current driving capacity.

In the foregoing description, both the drain region and the source region have the high withstand voltage capability. However, depending on device specifications, the drain region alone may have the high withstand voltage capability.

Hereafter, the common features of the masked-LDD transistor and the LOCOS offset transistor are discussed.

One common feature of the masked-LDD transistor and the LOCOS offset transistor is that the gate insulating film 51 has a large thickness of 80 nm. This film thickness is based on the assumed withstand voltage of 30 V; if the required withstand voltage is higher than 30 V, the film thickness is made even greater. Namely, since a high voltage is applied also to the gate electrode, the gate insulating film needs to be thick enough that it has a sufficient insulating property.

This poses an important issue with regard to both of these devices: since the gate insulating film 51 has the large film thickness of 80 nm, film formation takes a long process time. As a result, due to the influence of heat treatment during film formation, redistribution of the P-type well that is already formed and the channel-doping impurities for threshold voltage (Vth) adjustment occurs. Particularly, if the thickness of the gate insulating film becomes greater than about 50 nm, the oxidation time becomes extremely longer, resulting in a characteristics deviation in the completed device. This is not just the problem of the high withstand voltage transistor but it also affects other elements, such as capacitive and/or resistive elements or, in a case where another transistor for a separate use is formed on the same semiconductor substrate, such a device is also similarly affected. Thus, the problem of prolonged process time is one of the most significant factors blocking the realization of a complex/hybrid mounting.

Another problem associated with the thick gate insulating film is described with reference to FIGS. 44 to 47.

In a conventional manufacturing process for a high withstand voltage transistor, a thick gate insulating film 51 is formed on a semiconductor substrate 1 on which LOCOS oxide films 15 are formed. Then, a polycrystalline silicon film for forming a gate electrode 53 is formed over the entire surface of the wafer (see FIG. 44). The polycrystalline silicon film is then removed by etching using a resist pattern (not shown), to form the gate electrode 53 (see FIG. 45). After the thick gate insulating film 51 other than under the gate electrode 53 is removed by a wet etching technique, an N+ drain region 11d and an N+ source region 11s are formed by ion implantation (see FIG. 46).

In the above manufacturing process, the thick gate insulating film 51 is removed except for under the gate electrode 53. This is because, as shown in FIG. 45, if the thick gate insulating film 51 remains in the regions where the N+ drain region 11d and the N+ source region 11s are to be formed, the thick gate insulating film 51 blocks the ion implantation for forming the N+ drain region 11d and the N+ source region 11s and prevents their normal formation. Thus, as shown in FIG. 46, it is necessary to remove the thick gate insulating film 51 that remains in the planned regions for the N+ drain region 11d and the N+ source region 11s prior to ion implantation.

While the removal of the thick gate insulating film 51 is performed by wet etching, it takes a prolonged process to remove the thick gate insulating film 51 with its large film thickness of 80 nm.

Furthermore, the removal process results in a reduction of the LOCOS oxide films 15 that are already formed, such that the edges of the LOCOS oxide film 15 (within the broken-line circles in FIG. 46) develop a shape abnormality as indicated by recessed portions 55 (see FIG. 47). This leads not just to a deviation from design dimensions but it may also lead to abnormality in electrical characteristics.

Thus, there are a number of issues associated with the formation of the thick gate insulating film, making it difficult to realize a high withstand voltage transistor and its mounting with other devices in a complex/hybrid manner.

Patent Document 1: JP Patent No. 3275569

Patent Document 2: Japanese Laid-Open Patent Application No. 09-266255

Patent Document 3: Japanese Laid-Open Patent Application No. 2005-303037

SUMMARY

In an aspect of this disclosure, there is provided a semiconductor device comprising a MOS transistor that does not have the problems associated with the formation of a thick gate insulating film and that can be applied to high withstand voltage devices.

In another aspect, there is provided a semiconductor device comprising a MOS transistor, the MOS transistor comprising a semiconductor substrate of a first conductivity type; a drain region and a source region both of a second conductivity type disposed spaced apart from each other on a surface of the semiconductor substrate; a gate insulating film formed on the semiconductor substrate between the source region and the drain region; and a gate electrode formed on the gate insulating film. The semiconductor substrate between the source region and the drain region provides a channel region. The drain region comprises a first drain region disposed spaced apart from the gate insulating film and the channel region, and a second drain region disposed between and adjacent to the first drain region and the channel region. The gate electrode comprises a first gate electrode formed on the gate insulating film and a second gate electrode formed on the first gate electrode via a gate electrode insulating film. A gate wiring for providing a gate voltage is connected to the second gate electrode but not to the first gate electrode. The semiconductor device further comprises a field insulating film having a greater thickness than the gate insulating film, the field insulating film being disposed on the surface of the semiconductor substrate at least between the gate insulating film and the first drain region. An edge of the first gate electrode on the side of the drain region is disposed over the field insulating film.

The aforementioned MOS transistor includes the gate electrode which comprises the first gate electrode formed on the semiconductor substrate via the gate insulating film, and the second gate electrode formed on the first gate electrode via the gate electrode insulating film. The gate wiring for providing a gate voltage to the gate electrode is connected to the second gate electrode but not to the first gate electrode. In this structure, as regards the gate voltage, a voltage $V2$ applied to the gate electrode insulating film and a voltage $V1$ applied to the gate insulating film are determined by a capacitance value $C2$ between the second gate electrode and the first gate electrode, and a capacitance value $C1$ between the first gate electrode and the semiconductor substrate. Namely, even if the gate voltage applied to the gate electrode is a high voltage, the voltage V1 applied to the gate insulating film can be reduced by adjusting the capacitance values C1 and C2. Thus, the present invention can be applied to high withstand voltage devices to the gate electrode of which a gate voltage is applied, without using a thick gate insulating film. It is noted, however, that the semiconductor devices to which the present invention can be applied are not limited to those semiconductor devices comprising a MOS transistor having what is generally referred to as a high withstand voltage, such as 15 V or higher; the invention can be applied to semiconductor devices comprising a MOS transistor capable of high-speed operation with a low breakdown voltage.

An edge of the second gate electrode, as seen from above, may be disposed over the first gate electrode alone. In another embodiment, the device may comprise a pattern covering an edge and a side of the first gate electrode and disposed spaced apart from the second gate electrode, where the pattern is formed of the same material as and simultaneously with the second gate electrode. In these embodiments, the formation of a processing residue at the sides of the first gate electrode can be prevented, the processing residue being formed of the material for forming the second gate electrode. Thus, problems arising from the processing residue, such as electric short circuit in a wiring portion, can be prevented.

In another embodiment, the edges of the second gate electrode, as seen from above, are partly or entirely disposed outside the edges of the first gate electrode. A portion of the second gate electrode that is disposed outside the edges of the first gate electrode is disposed over the field insulating film, the portion being disposed over the first gate electrode via the gate electrode insulating film. Thus, the capacitance value between the first gate electrode and the second gate electrode can be adjusted by way of the sides of the first gate electrode.

In yet another embodiment, all of the edges of the second gate electrode, as seen from above, are disposed outside the edges of the first gate electrode, covering the edges and sides of the first gate electrode. Thus, the formation of a processing residue at the sides of the first gate electrode can be prevented, the residue being formed of the material for forming the second gate electrode. In this way, problems arising from such a processing residue, such as an electric short circuit in a wiring portion, can be prevented.

As seen from above, there may be a region over the first gate electrode that is spaced apart from the edges of the first gate electrode where the second gate electrode is not formed. In this way, the capacitance value between the first gate electrode and the second gate electrode can be increased compared with the case where the second gate electrode is formed over the entire surface of the first gate electrode, while preventing the formation of the processing residue at the sides of the first gate electrode, the residue being formed of the material for forming the second gate electrode.

In another embodiment, the device further comprises a plurality of the MOS transistors having different capacitance values between the first gate electrode and the second gate electrode. Thus, plural MOS transistors having different operating voltages can be mounted on the same semiconductor substrate in a hybrid manner.

In another embodiment, the plural MOS transistors differ from each other only in terms of the layout area of the second gate electrode. Thus, plural MOS transistors having different operating voltages can be formed without increasing the number of the manufacturing process steps.

In another embodiment, the device further comprises a capacitive element which comprises a first capacitive element electrode formed on the semiconductor substrate of the same material as and simultaneously with the first gate electrode; and a second capacitive element electrode formed on the first capacitive element electrode of the same material as and simultaneously with the second gate electrode, via an insulating film. Thus, the invention can be readily applied to analog circuits.

BEST MODE FOR CARRYING OUT THE INVENTION

Figure 1:
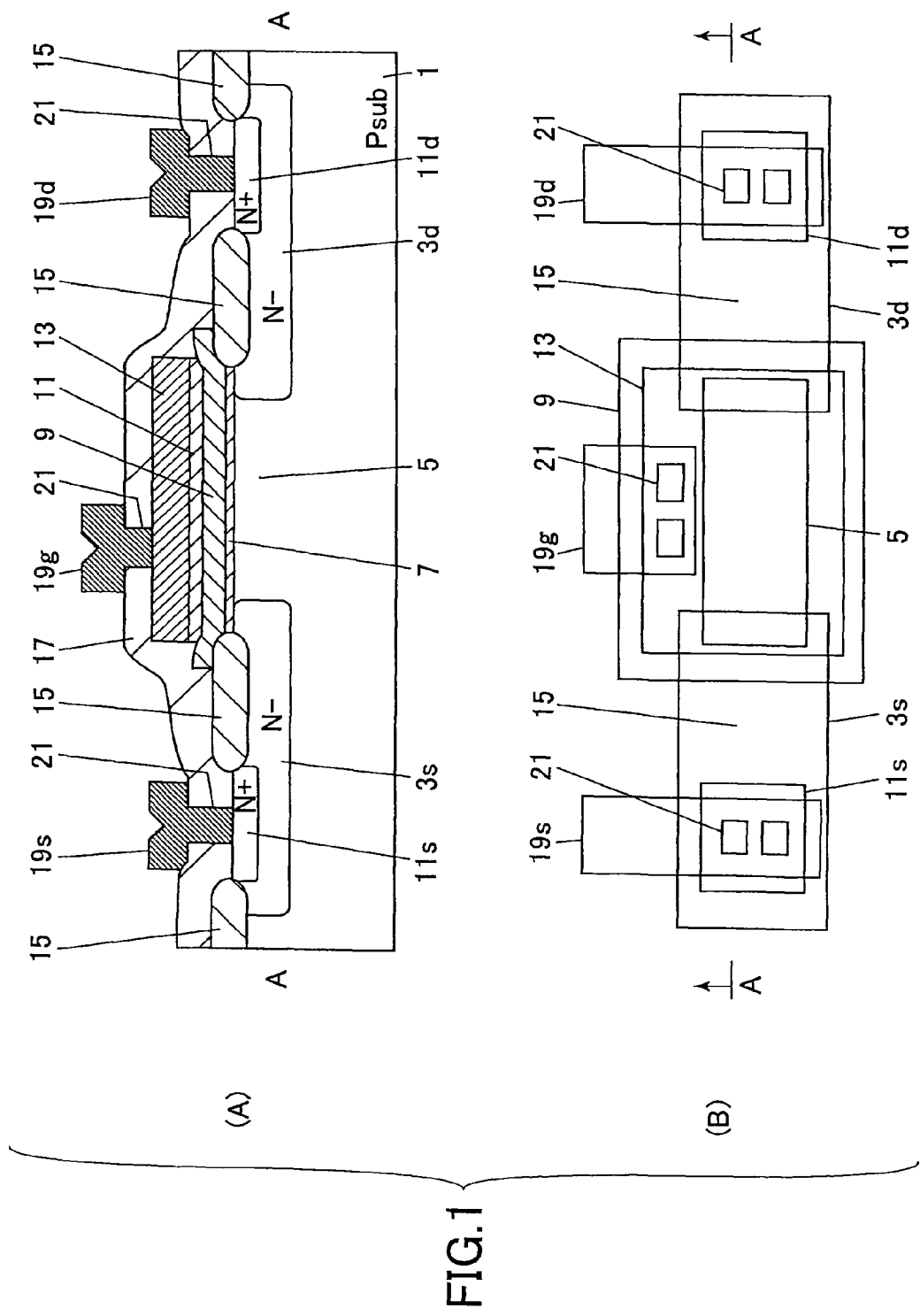
FIG. 1 schematically shows an embodiment of the invention, (A) showing a cross section and (B) showing a plan view.
Figure 2:
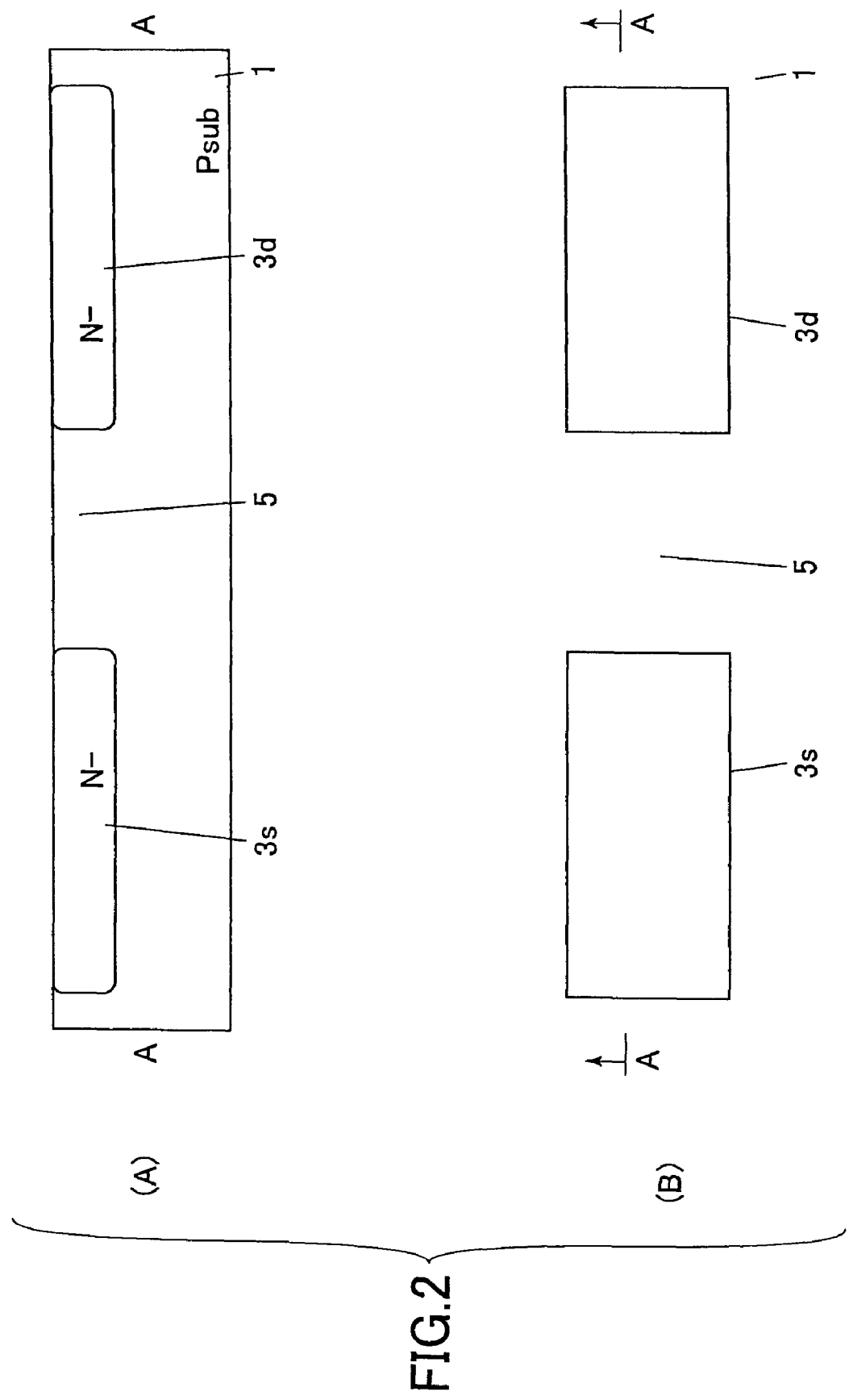
FIG. 2 illustrates a first step of a process of manufacturing a LOCOS offset transistor according to the embodiment of FIG. 1, (A) showing a cross section and (B) showing a plan view.

FIG. 1 shows an embodiment of the invention, (A) showing a cross section and (B) showing a plan view. The cross section (A) is taken along line A-A of (B). In FIG. 1(B), portions that are invisible as seen from above are also indicated by solid lines. In FIG. 1(A), a gate wiring and a gate contact are also schematically shown.

On the surface of a P-type semiconductor substrate (Psub) 1, an N-drain region 3d and an N− source region 3s are formed spaced apart from each other. The semiconductor substrate 1 between the N− drain region 3d and the N-source region 3s provides a channel region 5. On the semiconductor substrate 1 between the N-drain region 3d and the N-source region 3s, a gate insulating film 7 is formed. The gate insulating film 7, which may comprise a silicon oxide film, has a film thickness of 20 nm. While not shown in the drawings, a P-type well region is formed in the semiconductor substrate 1 in regions where the N− drain region 3d, the N-source region 3s, and the channel region 5 are formed.

On the gate insulating film 7, a first gate electrode 9 is formed. The first gate electrode 9, which may comprise a polycrystalline silicon film, has a film thickness of 300 nm.

On the first gate electrode 9, a second gate electrode 13 is formed via a gate electrode insulating film 11. The gate electrode insulating film 11, which may comprise a silicon oxide film, has a film thickness of 20 nm. The second gate electrode 13 may comprise a polycrystalline silicon film; it has a film thickness of 300 nm.

On the surface of the N-drain region 3d, an N+ drain region 11d is formed spaced apart from the edges of the N-drain region 3d. On the surface of the N-source region 3s, an N+ source region 11s is formed spaced apart from the edges of the N-source region 3s. The N+ drain region 11d and the N+ source region 11s have higher concentrations of an N-type impurity than do the N-drain region 3d and the N− source region 3s. Thus, the drain region and the source region have a double diffusion structure.

On the surface of the semiconductor substrate 1, LOCOS oxide films (field insulating film) 15 are formed to define a region for forming a LOCOS offset transistor. The LOCOS oxide films 15 have a greater film thickness than the gate insulating film 7, such as 500 nm. The LOCOS oxide films 15 are also formed on the surface of the N− drain region 3d between the edge of the N-drain region 3d on the side of the channel region 5 and the N+ drain region 11d, and on the surface of the N− source region 3s between the edge of the N-source region 3s on the side of the channel region 5 and the N+ source region 11s. The edges of the first gate electrode 9 are disposed over the LOCOS oxide film 15. The edges of the first gate electrode 9 on the side of the N+ drain region 11d and on the side of the N+ source region 11s are, as seen from above, spaced apart from the N+ drain region 11d and the N+ source region 11s, respectively.

Over the semiconductor substrate 1, a silicon oxide insulating film 17 is formed covering the first gate electrode 9, the second gate electrode 13, the N+ drain region 11d, the N+ source region 11s, and the LOCOS oxide films 15. On the silicon oxide insulating film 17, a gate wiring 19g, a drain wiring 19d, and a source wiring 19s are formed of a metal material, such as aluminum. Via connection holes 21 formed in the silicon oxide insulating film 17, the gate wiring 19g is connected to the second gate electrode 13; the drain wiring 19d is connected to the N+ drain region 11d; and the source wiring 19s is connected to the N+ source region 11s. The gate wiring 19g is not connected to the first gate electrode 9.

FIGS. 2 through 7 show sequentially a process of fabricating the LOCOS offset transistor shown in FIG. 1. In each of the figures, (A) shows a cross section and (B) shows a plan view, where the cross section of (A) is taken along line A-A of (B). In (B), portions that are invisible as seen from above are also indicated by solid lines. With reference to FIGS. 1 through 7, the manufacturing process is described.

After the P-type well region, not shown, is formed in the P-type semiconductor substrate 1, a resist pattern (not shown) is formed by a photomechanical technique. Using the resist pattern as a mask, phosphorus is ion-implanted under the conditions of an implantation energy of 100 KeV and a dose of $2.0 \times 10^{13}$ cm$^{-2}$. After the resist pattern is removed, the substrate is exposed to a nitrogen atmosphere at 1000° C. for 30 minutes, whereby the implanted phosphorus is diffused and activated, thus forming the N-drain region 3d and the N-source region 3s of low concentration (see FIG. 2).

Figure 3:
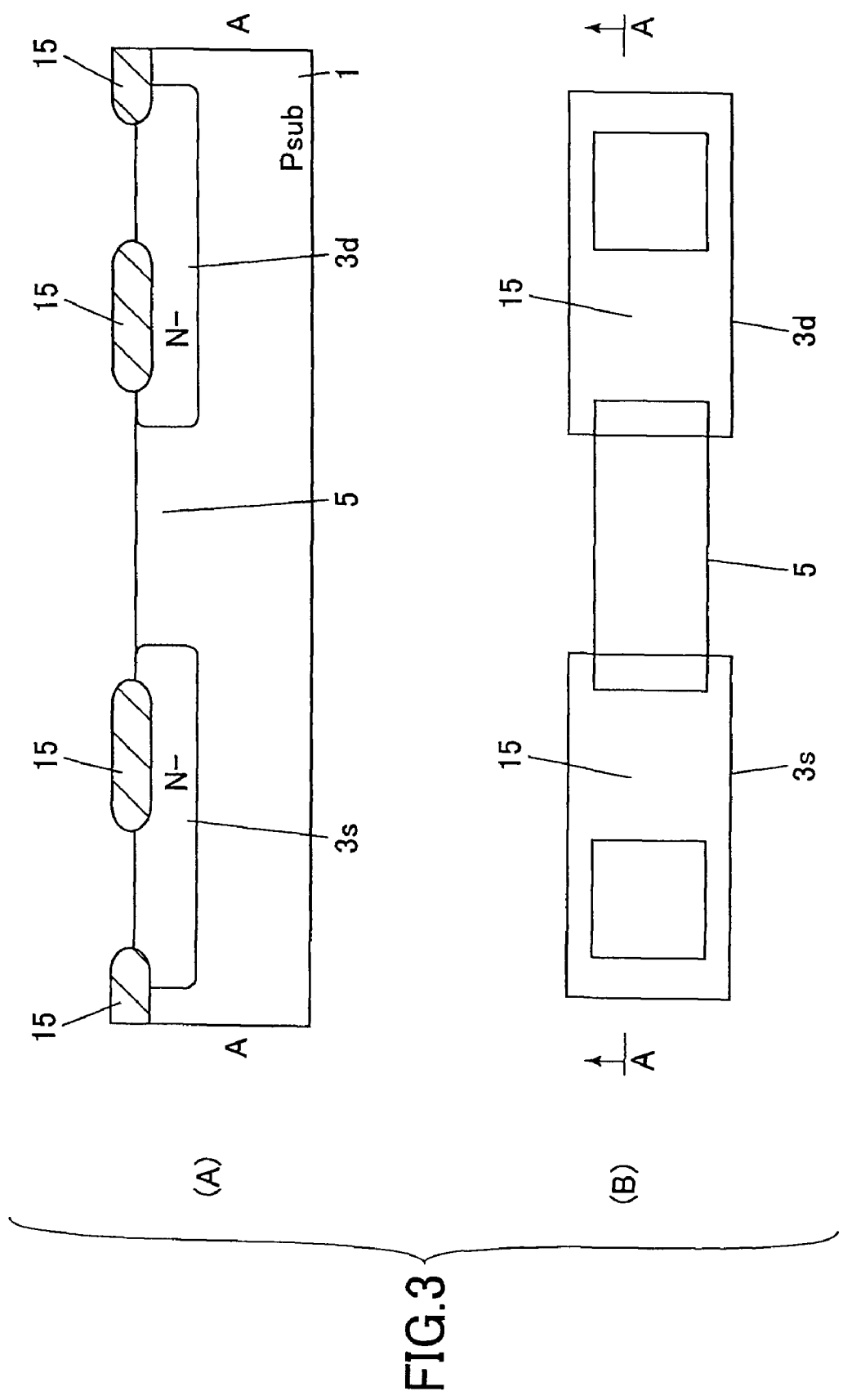
FIG. 3 illustrates a subsequent step of the manufacturing process, (A) showing a cross section and (B) showing a plan view.
Figure 4:
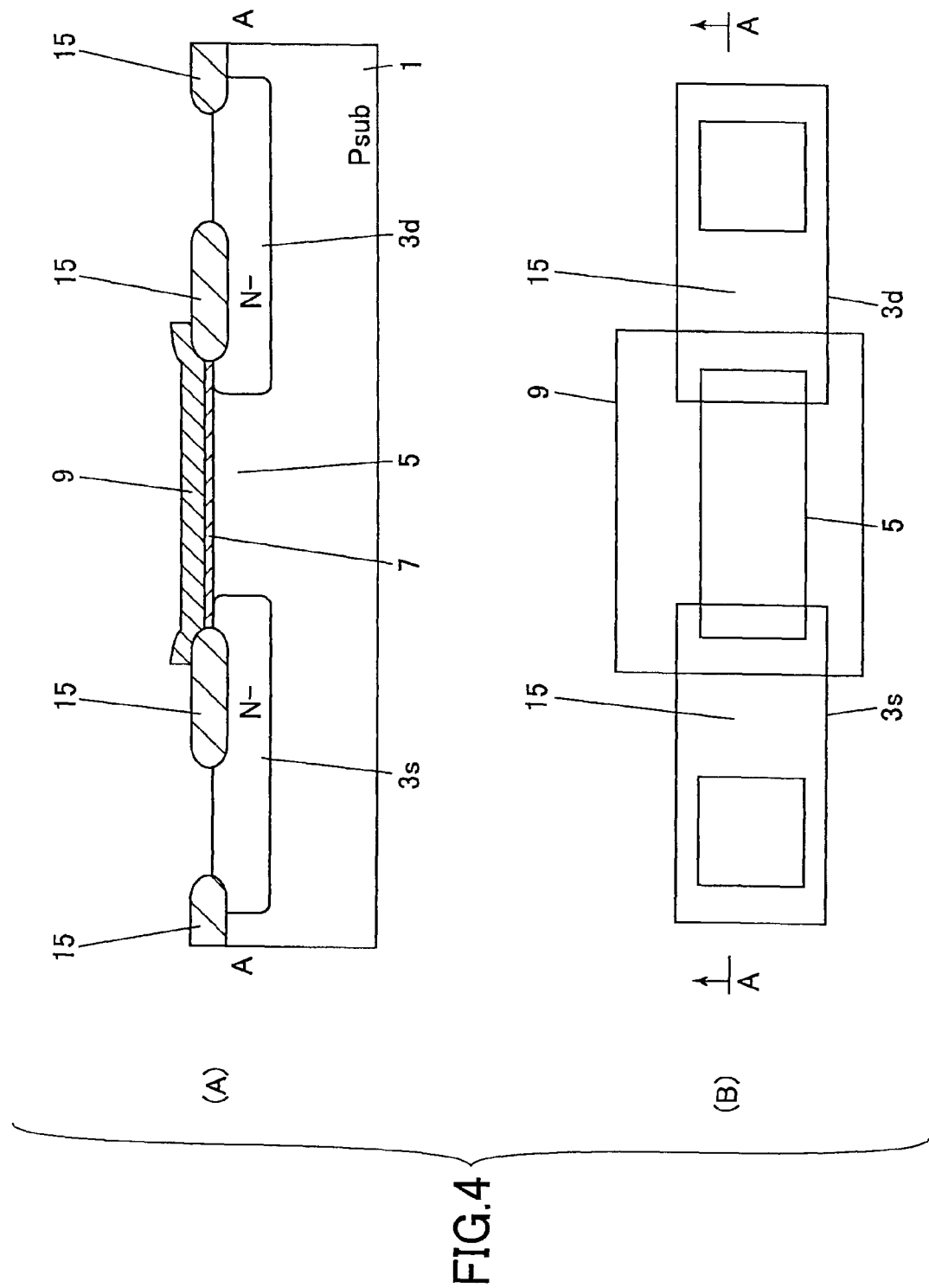
FIG. 4 illustrates a subsequent step of the manufacturing process, (A) showing a cross section and (B) showing a plan view.
Figure 5:
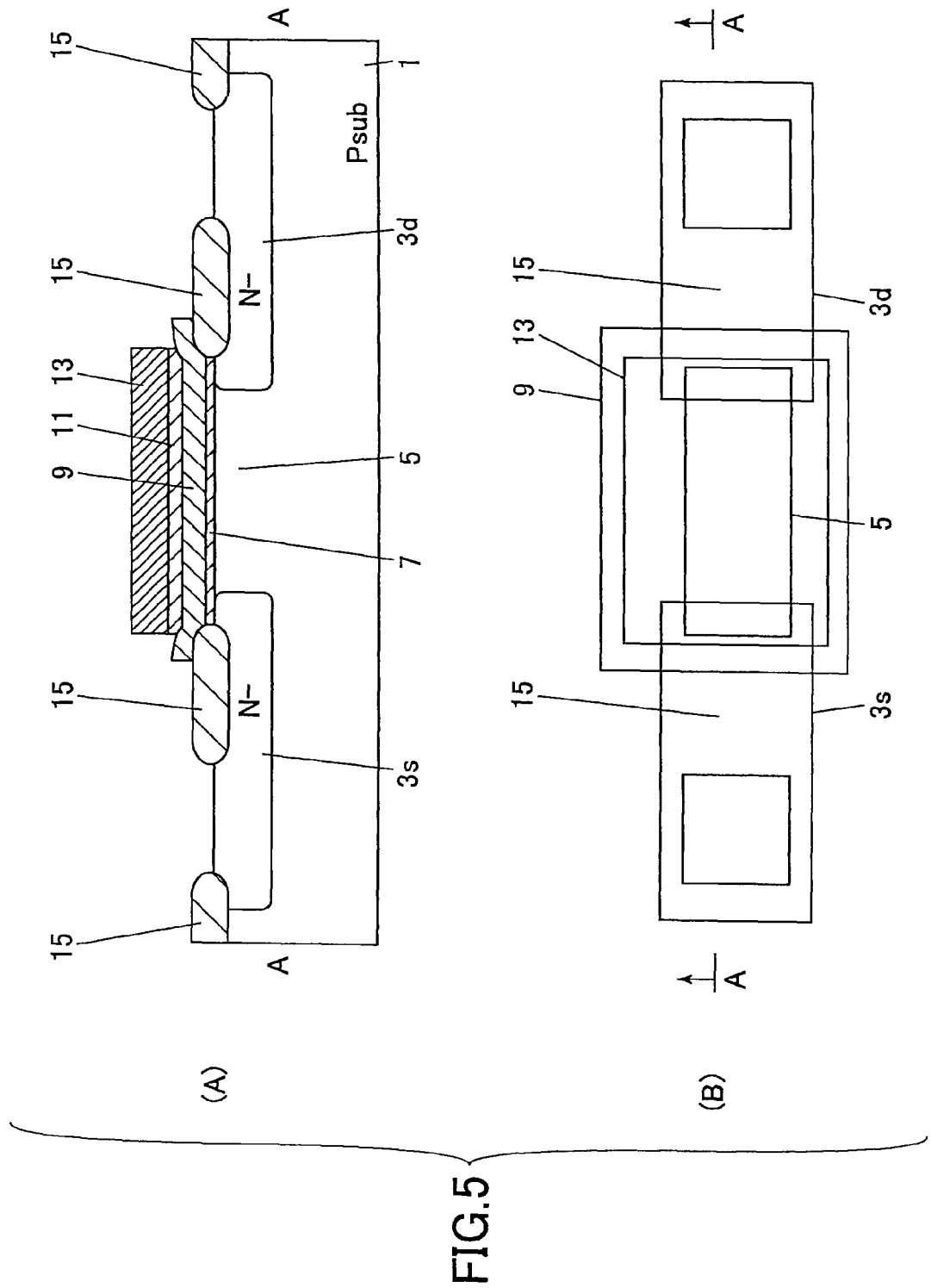
FIG. 5 illustrates a subsequent step of the manufacturing process, (A) showing a cross section and (B) showing a plan view.
Figure 6:
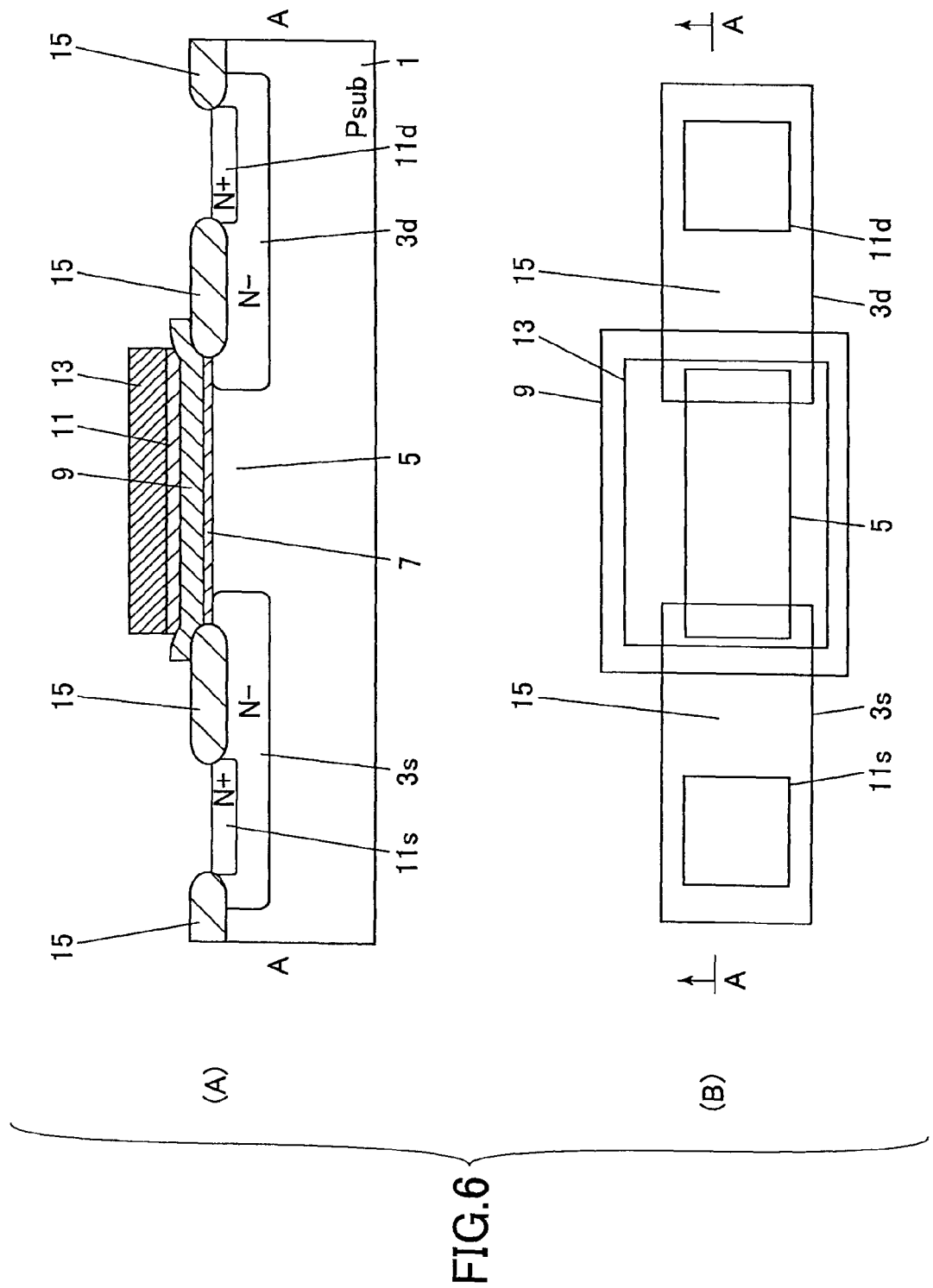
FIG. 6 illustrates a subsequent step of the manufacturing process, (A) showing a cross section and (B) showing a plan view.
Figure 7:
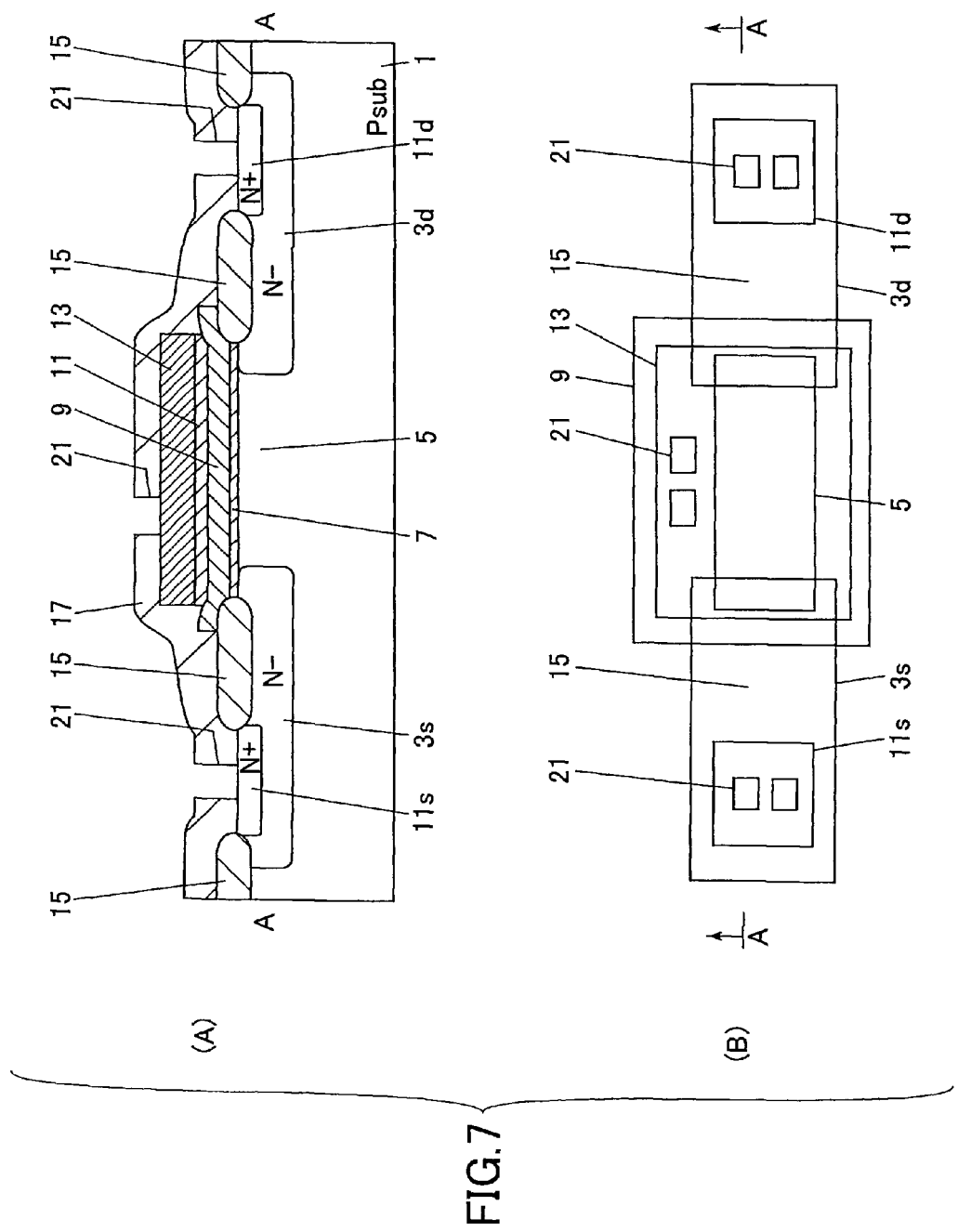
FIG. 7 illustrates a subsequent step of the manufacturing process, (A) showing a cross section and (B) showing a plan view.

Using an existing isolation formation technique, the LOCOS oxide films 15 are formed to a film thickness of 500 nm (see FIG. 3).

After the gate insulating film 7 is formed to a film thickness of 20 nm, a polycrystalline silicon film is successively deposited to a thickness of 300 nm. Using a photomechanical technique, a resist pattern is formed and, using the resist pattern as a mask, the polycrystalline silicon film and the gate insulating film 7 are successively removed by an anisotropic dry etching technique, thereby forming the first gate electrode 9 of the polycrystalline silicon film and the gate insulating film 7 only under the first gate electrode 9. Thereafter, the resist pattern is removed (see FIG. 4). The edges of the first gate electrode 9 are disposed over the LOCOS oxide film 15. The removal of the gate insulating film 7 by etching may involve a wet etching technique.

After the gate electrode insulating film 11 is formed on the surface of the first gate electrode 9 to a film thickness of 20 nm, a polycrystalline silicon film is successively deposited to a thickness of 300 nm. Then, a resist pattern is formed by a photomechanical technique and, using the pattern as a mask, the polycrystalline silicon film and the gate electrode insulating film 11 are successively removed by an anisotropic dry etching technique, thereby forming the second gate electrode 13 of the polycrystalline silicon film and the gate electrode insulating film 11 only under the second gate electrode 13. Thereafter, the resist pattern is removed (see FIG. 5). The edges of the second gate electrode 13, as seen from above, are disposed over the first gate electrode 9. The removal of the gate electrode insulating film 11 by etching may involve a wet etching technique.

After a resist pattern having openings in regions for forming the LOCOS offset transistor is formed, arsenic is ion-implanted under the conditions of an implantation energy of 30 KeV and a dose of $5.0 \times 10^{15}$ cm$^{-2}$. After the resist pattern is removed, the substrate is exposed to a nitrogen atmosphere at 900° C. for 30 minutes, whereby the implanted arsenic is diffused and activated, forming the N+ drain region 11d and the N+ source region 11s of high concentration (see FIG. 6). The N+ drain region 11d and the surrounding low concentration N-drain region 3d constitute the drain region, while the N+ source region 11s and the surrounding low concentration N− source region 3s constitute the source region.

Over the entire surface of the semiconductor substrate 1, the silicon oxide insulating film 17, such as a laminate film consisting of an NSG (Non-doped Silicate Glass) film and a BPSG (Boro-phospho Silicate Glass) film is deposited to a film thickness of 1000 nm. After a resist pattern is formed, predetermined locations of the silicon oxide insulating film 17 are removed by etching, using the resist pattern as a mask, whereby the connection holes 21 are formed at the positions corresponding to the N+ drain region 11d, the N+ source region 11s, and the second gate electrode 13 (see FIG. 7).

Thereafter, an aluminum metal film, for example, is formed over the silicon oxide insulating film 17 and then patterned to form the gate wiring 19g, the drain wiring 19d, and the source wiring 19s (see FIG. 1).

In the foregoing embodiment, because of the features that (1) the drain region and the source region have a double diffusion structure; and that (2) the edges of the first gate electrode 9 are disposed over the LOCOS oxide film 15, which has a greater thickness than the gate insulating film 7, the drain region and the source region can withstand a high voltage.

Furthermore, since the device has a laminated gate electrode structure comprising the first gate electrode 9 over which the second gate electrode 13 is disposed via the gate electrode insulating film 11, the gate voltage applied to the second gate electrode 13 is divided between the gate electrode insulating film 11 and the gate insulating film 7. Thus, the gate electrode can also withstand a high voltage. This is described with reference to FIGS. 1 and 8.

Figure 8:
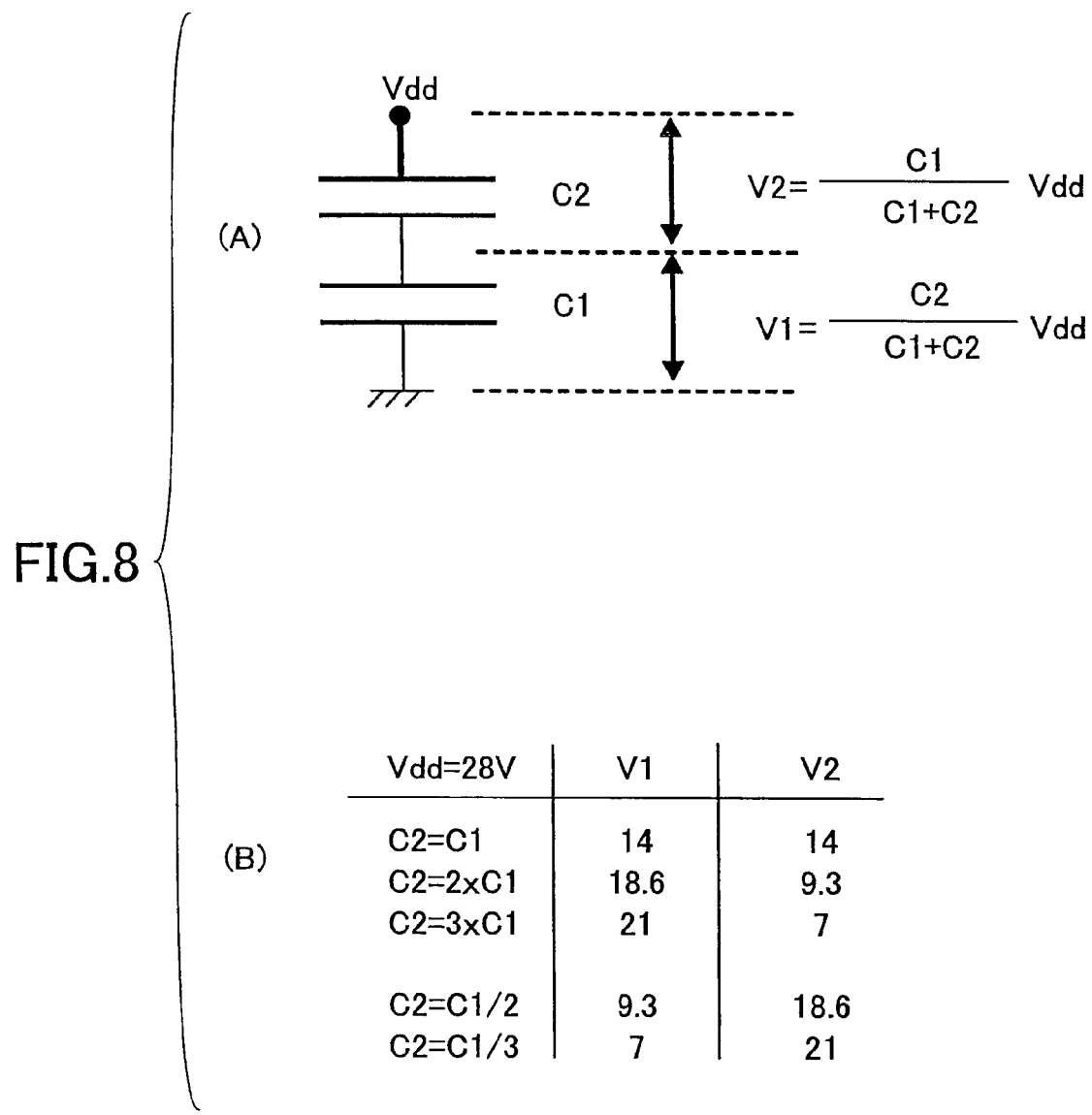
FIG. 8 illustrates how a gate voltage applied to a second gate electrode is divided between a gate electrode insulating film and a gate insulating film, (A) showing a circuit diagram of the gate electrode and equations of voltages V1 and V2 applied to the gate insulating film and the gate electrode insulating film and (B) showing a table of voltages V1 and V2 with respect to ratios of capacitance values of C1 to C2, C1 being a capacitance value between a first gate electrode 9 and a semiconductor substrate 1 and C2 being a capacitance value between a second gate electrode 131 and the gate electrode.

With reference to FIG. 8, how the gate voltage applied to the second gate electrode 13 is divided between the gate electrode insulating film 11 and the gate insulating film 7 is described. FIG. 8(A) shows a circuit diagram of the gate electrode and equations for voltages V1 and V2 fed to the gate insulating film 7 and the gate electrode insulating film 11. FIG. 8(B) shows a table of voltages V1 and V2 with respect to various ratios of capacitance values C1 to C2, where C1 is the capacitance value between the first gate electrode 9 and the semiconductor substrate 1 and C2 is the capacitance value between the second gate electrode 13 and the first gate electrode 9.

When the capacitance value between the first gate electrode 9 and the semiconductor substrate 1 is C1 and the capacitance value between the second gate electrode 13 and the first gate electrode 9 is C2, voltage V1 applied to the gate insulating film 7 and voltage V2 applied to the gate electrode insulating film 11 are calculated by the equations shown in FIG. 8.

When C1=C2, voltage V1 applied to the second gate electrode 13 is reduced to one half the gate voltage (Vdd) applied to the second gate electrode 13. This indicates that the gate insulating film thickness need only be one half the conventional thickness. Namely, it becomes possible to provide the gate electrode with the high withstand voltage capability without forming the thick gate insulating film through a long period of heat treatment.

In this embodiment, while the gate electrode insulating film 11 is described as comprising a single layer film of silicon oxide, the gate electrode insulating film may comprise a laminate film consisting of a silicon oxide/silicon nitride/silicon oxide ("ONO") film. Generally, an ONO film has a higher insulating resistance than a silicon oxide single-layer film, so that a greater part of the voltage value applied to the second gate electrode 13 can be carried by the ONO film. Namely, the voltage applied to the gate insulating film 7 can be reduced. In addition, since the gate insulating film 7 can be obtained in the form of the silicon oxide film as is, no problem of shifting in electric characteristics due to the acquisition of hot carriers arises in principle.

The voltage V1 applied to the gate insulating film 7 can be calculated from the equations shown in FIG. 8. By employing an ONO film for the gate electrode insulating film 11, insulating resistance can be improved, i.e., the divided voltage V2 can be increased. An active utilization of this fact is described below. Namely, C2 is set smaller than C1. For example, when C2=C1/3, V2=21V and V1=7V when Vdd=28V as indicated by the calculation results shown in FIG. 8; i.e., only 7V is applied to the gate insulating film 7 in the high voltage environment where drive voltage Vdd=28V.

Figure 9:
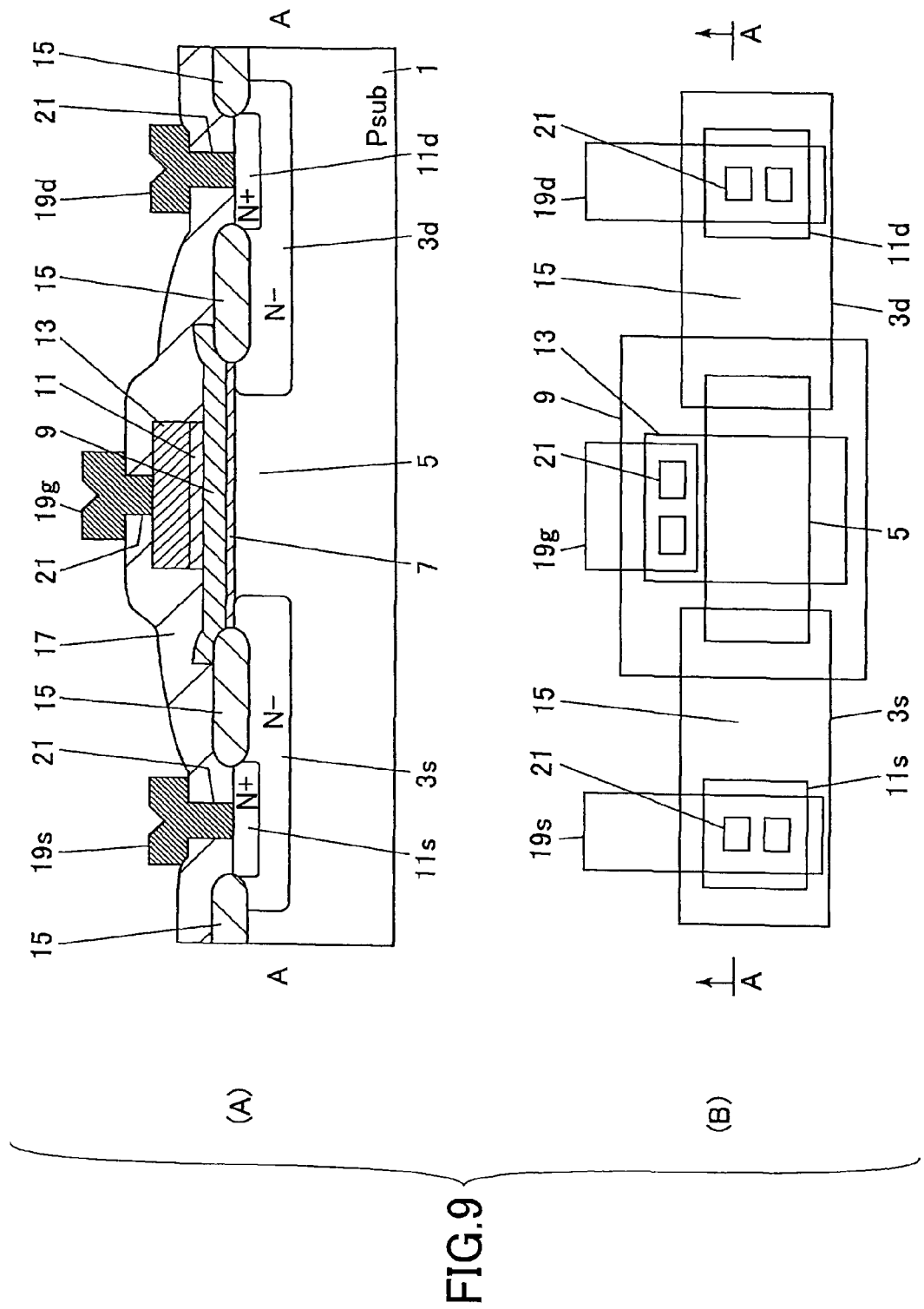
FIG. 9 schematically shows another embodiment, (A) showing a cross section and (B) showing a plan view.

Furthermore, as shown in FIG. 9, by making the area of the gate insulating film 7 between the semiconductor substrate 1 and the first gate electrode 9 larger than the area of the gate electrode insulating film 9 between the first gate electrode 9 and the second gate electrode 13, C2 can be reduced. Thus, by adjusting the ratio of the area of the gate insulating film 7, which is disposed between the semiconductor substrate 1 and the first gate electrode 9, to the area of the gate electrode insulating film 9 disposed between the first gate electrode 9 and the second gate electrode 13, the voltage applied to the gate insulating film 7 can be controlled relative to the gate voltage applied to the second gate electrode 13.

The capacitance values C1 and C2 can also be controlled by adjusting the film thickness of the gate insulating film 7 and the gate electrode insulating film 11, whereby the voltage applied to the gate insulating film 7 can be adjusted to a desired value.

Thus, the voltage applied to the gate insulating film 7 relative to the gate voltage applied to the second gate electrode 13 can be controlled either by the film type of the gate insulating film 7 and the gate electrode insulating film 11; by the areas of the gate insulating film 7 and the gate electrode insulating film 11; or by the film thicknesses of the gate insulating film 7 and the gate electrode insulating film 11.

Figure 10:
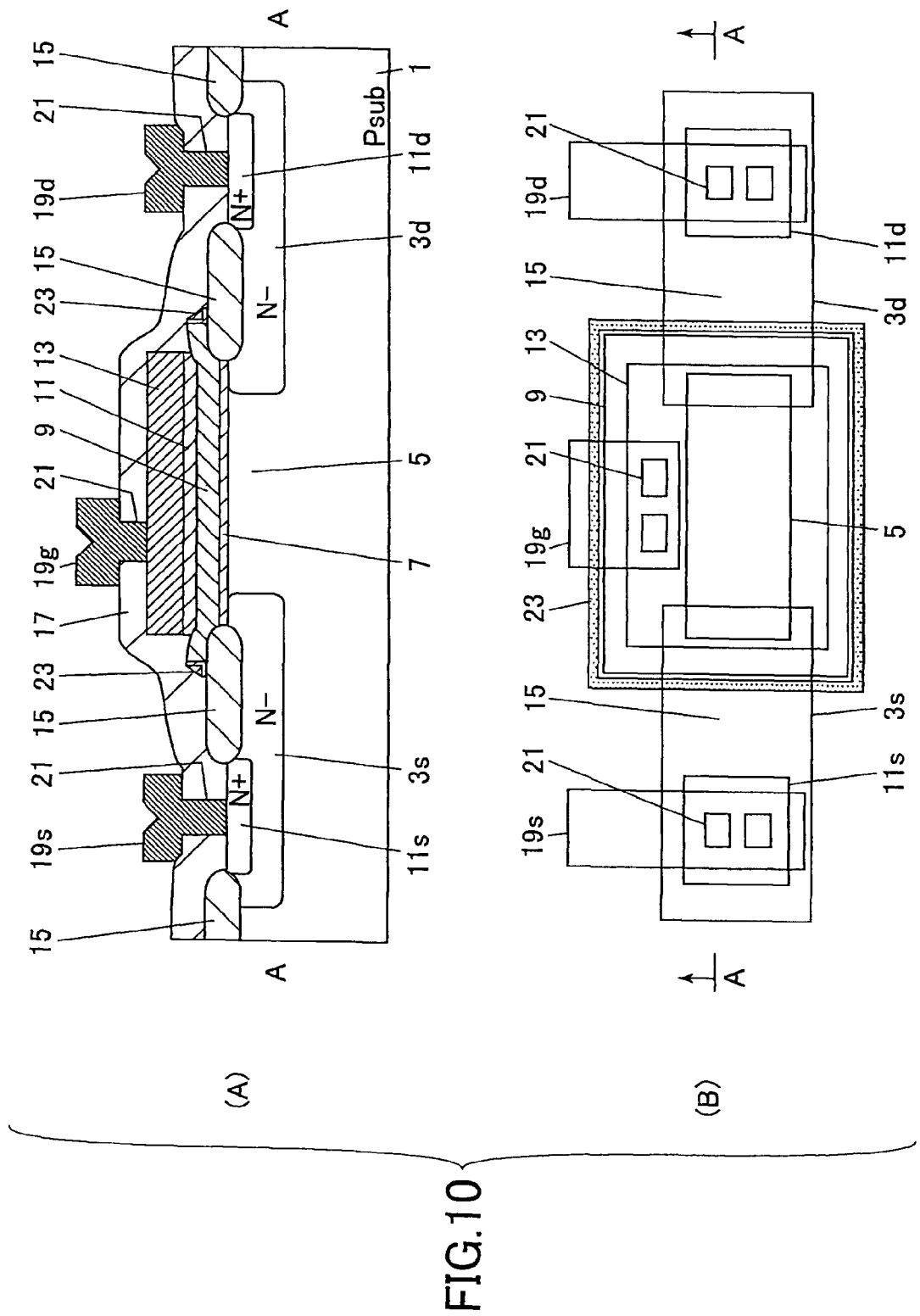
FIG. 10 schematically shows another embodiment, (A) showing a cross section and (B) showing a plan view.

In the manufacturing process according to the foregoing embodiment of FIG. 1, after the formation of the first gate electrode 9, the polycrystalline silicon film is formed on the entire surface of the semiconductor substrate 1 via the gate electrode insulating film 11, and then the polycrystalline silicon film is patterned by an anisotropic dry etching technique to form the second gate electrode 13. As a result, a polycrystalline silicon processing residue 23 (indicated by a dotted pattern in FIG. 10(B)) may be formed at the sides of the first gate electrode 9, as shown in FIG. 10. The polycrystalline silicon processing residue 23 is formed over N-regions 3d and 3s via an insulating film pattern which is formed of the same material as and simultaneously with the gate electrode insulating film 11 and the first gate electrode 9.

Figure 48:
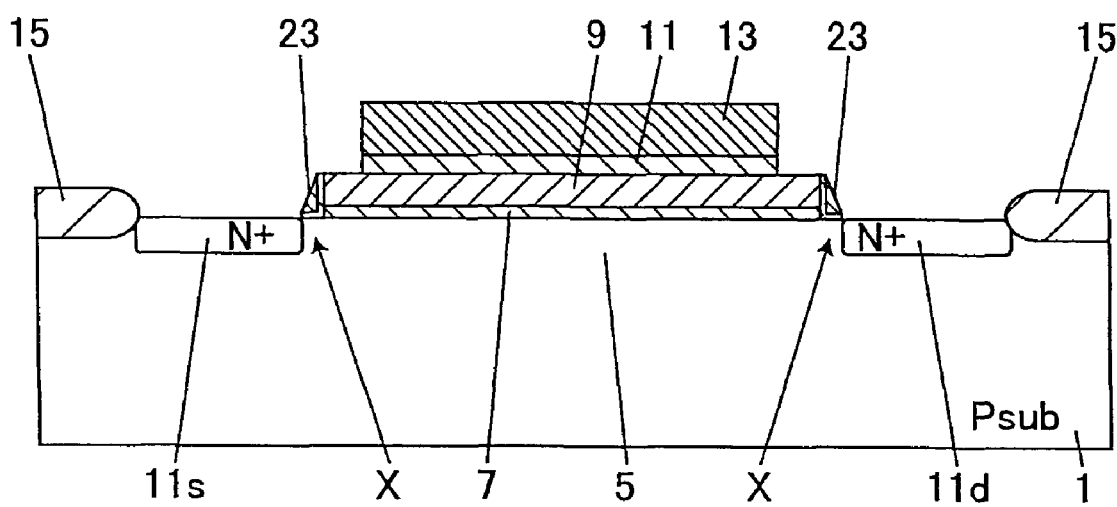
FIG. 48 shows a cross section illustrating a problem encountered when a laminated gate electrode structure according to the invention is applied to a conventional MOS transistor.

In the present embodiment, since the polycrystalline silicon processing residue 23 is formed on the LOCOS oxide films 15, and since the first gate electrode 9 and the second gate electrode 13 are insulated from each other, the polycrystalline silicon processing residue 23 does not adversely affect the transistor operation. If, however, the laminated gate electrode structure of the present invention shown in FIG. 48 is applied to a conventional MOS transistor, the polycrystalline silicon processing residue 23 poses a shield during ion implantation for forming the N+ regions 11d and 11s, preventing the implantation of ions in portions indicated by the sign X. As a result, as seen from above, the N+ regions 11d and 11s are formed spaced apart from the first gate electrode 9. Thus, the laminated gate electrode structure of the present invention cannot be adopted in conventional MOS transistor structures.

In the embodiment shown in FIG. 10, while the polycrystalline silicon processing residue 23 does not adversely affect transistor operation, if the polycrystalline silicon processing residue 23 peels off during the manufacturing process and moves over the semiconductor substrate, the polycrystalline silicon processing residue 23 becomes a so-called foreign matter which can cause an electrical short-circuit in wirings or a decrease in yield.

In the following, an embodiment in which the polycrystalline silicon processing residue 23 does not occur is described.

Figure 11:
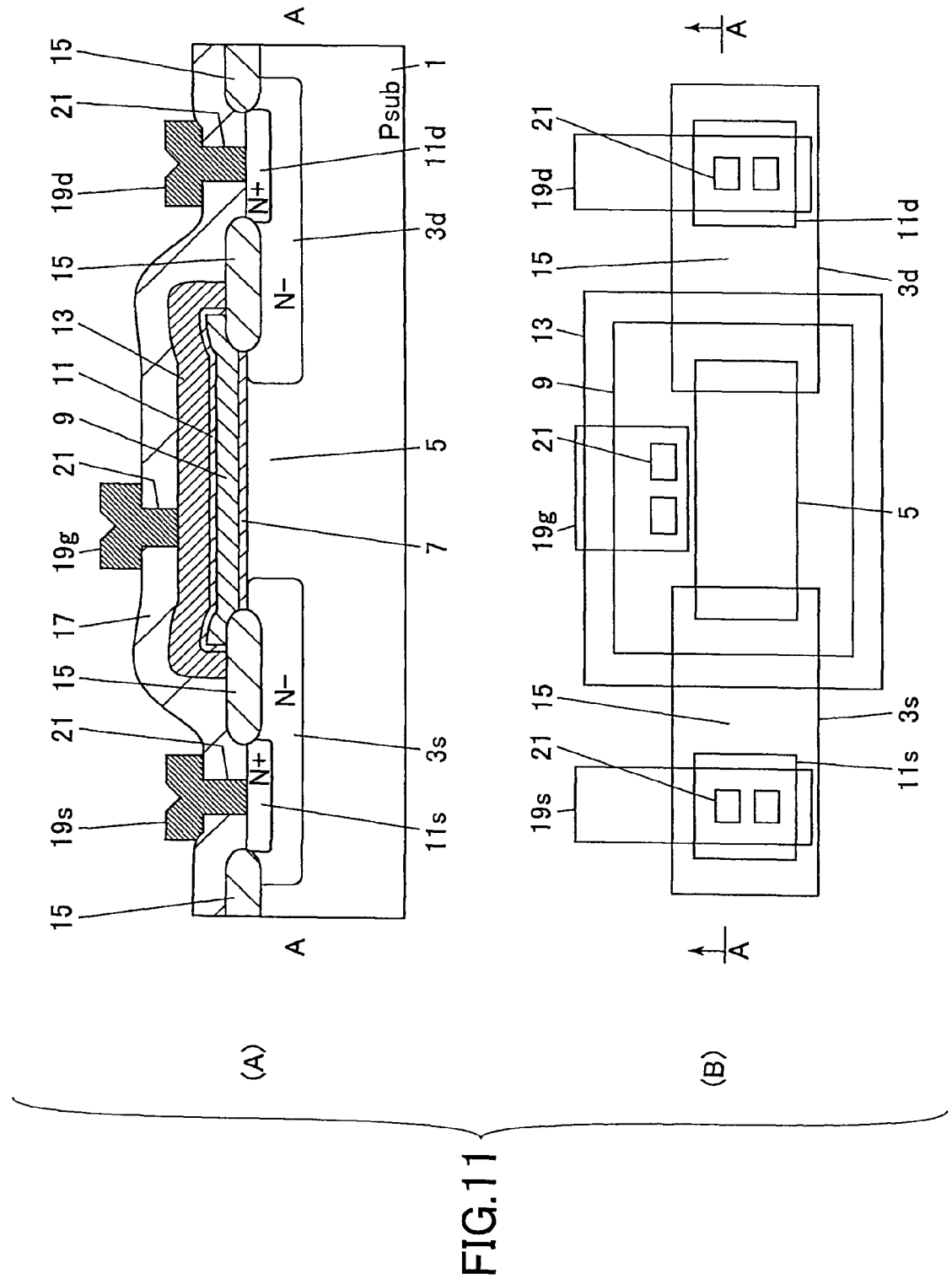
FIG. 11 schematically shows another embodiment, (A) showing a cross section and (B) showing a plan view.

FIG. 11 schematically shows the other embodiment. FIG. 11(A) shows a cross section and FIG. 11(B) shows a plan view, (A) showing a cross section taken along line A-A of (B). In (B), portions that are invisible as seen from above are also indicated by solid lines. In (A), a gate wiring and a gate contact are also schematically shown. Portions that perform the same functions as those of the portions shown in FIG. 1 are designated with similar numerals.

In this embodiment, all of the edges of the second gate electrode 13 are disposed outside the edges of the first gate electrode 9 as seen from above, the second gate electrode 13 covering the sides of the first gate electrode 9. Portions of the second gate electrode 13 that are disposed outside the edges of the first gate electrode 9 are disposed over the LOCOS oxide films 15. Between the first gate electrode 9 and the second gate electrode 13, a gate electrode insulating film 11 is formed.

Because the second gate electrode 13 covers the sides of the first gate electrode 9, the polycrystalline silicon processing residue 23 (see FIG. 10) is not formed at the sides of the second gate electrode 13 during the patterning of the polycrystalline silicon film by an anisotropic dry etching technique for forming the second gate electrode 13. Thus, the problem of the polycrystalline silicon processing residue 23 can be prevented.

Furthermore, since the portions of the second gate electrode 13 that are disposed outside the edges of the first gate electrode 9 are disposed over the LOCOS oxide films 15, the gate voltage applied to the second gate electrode 13 does not directly affect the gate insulating film 7; namely, the high withstand voltage capability can be maintained.

Furthermore, since the capacitance value between the first gate electrode 9 and the second gate electrode 13 can be also adjusted by way of the sides of the first gate electrode 9, a greater degree of freedom of design can be achieved.

While in the embodiment shown in FIG. 11 the second gate electrode 13 is disposed over the entire surface of the first gate electrode 9, the present invention is not limited by the embodiment.

Figure 12:
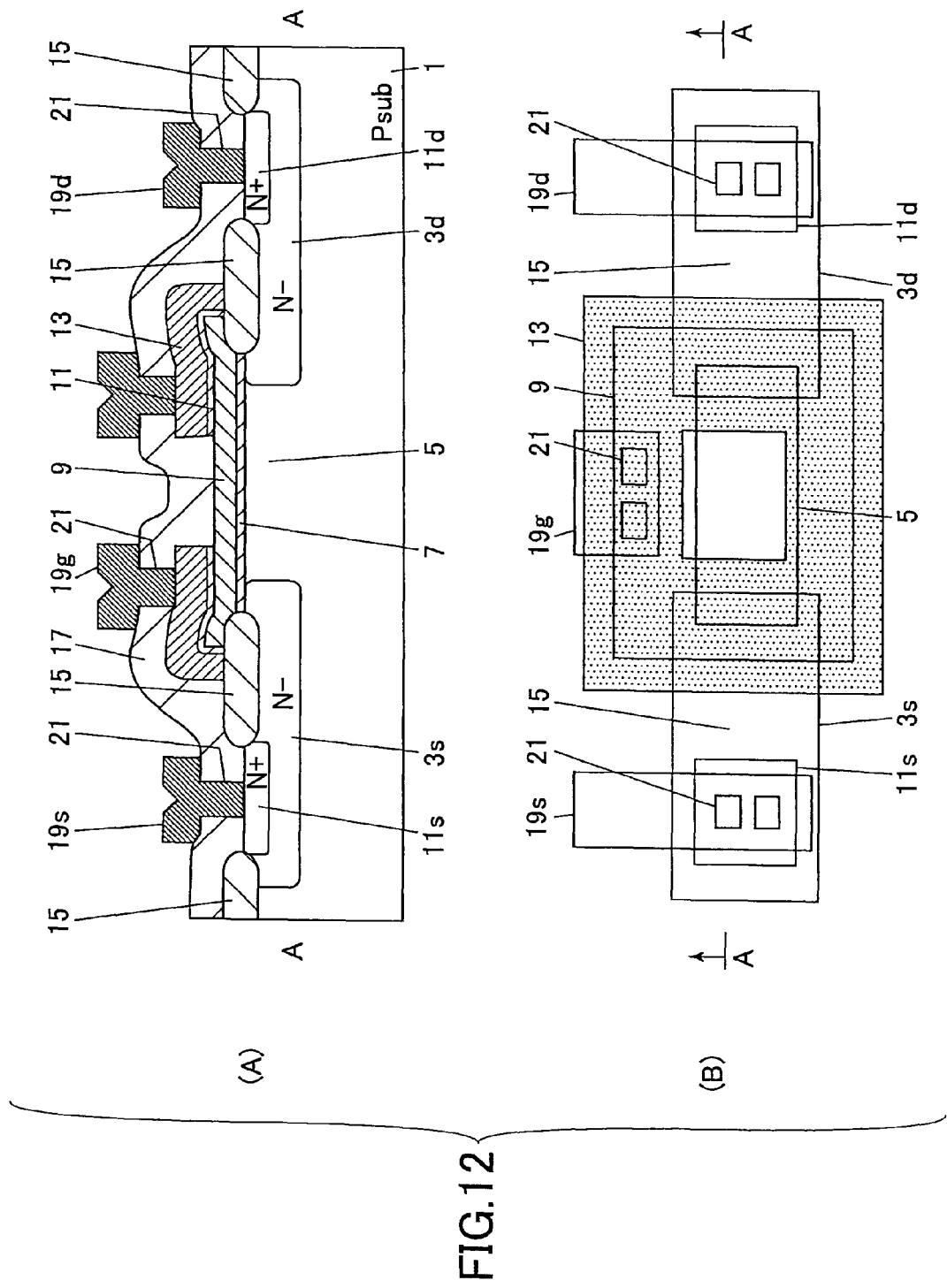
FIG. 12 schematically shows another embodiment, (A) showing a cross section and (B) showing a plan view.

FIG. 12 schematically shows another embodiment of the invention, (A) showing a cross section and (B) showing a plan view. The cross section of (A) is taken along line A-A of (B). In (B), portions that are invisible as seen from above are also indicated by solid lines. In (A), a gate wiring and a gate contact are also schematically shown. Portions having the same functions as those of the portions shown in FIG. 1 or 11 are designated with similar numerals. In (B), the second electrode is indicated by a dotted pattern.

In this embodiment, compared with the embodiment shown in FIG. 11, there is a region over the first gate electrode 9 that is spaced apart from the edges of the first gate electrode 9 and where the second gate electrode 13 is not formed. In this way, the capacitance value between the first gate electrode 9 and the second gate electrode 13 can be increased, compared with the embodiment shown in FIG. 11.

By adjusting the area of the region over the first gate electrode 9 where the second gate electrode 13 is not formed, the capacitance value between the first gate electrode 9 and the second gate electrode 13 can be set to an arbitrary value.

In the embodiment shown in FIG. 12, the region over the first gate electrode 9 where the second gate electrode 13 is not formed is rectangular and disposed at a single location. However, this is merely an example. In other embodiments, such a region may be provided at plural locations over the single gate electrode 9, or its planar shape may be other than rectangular, such as circular.

Figure 13:
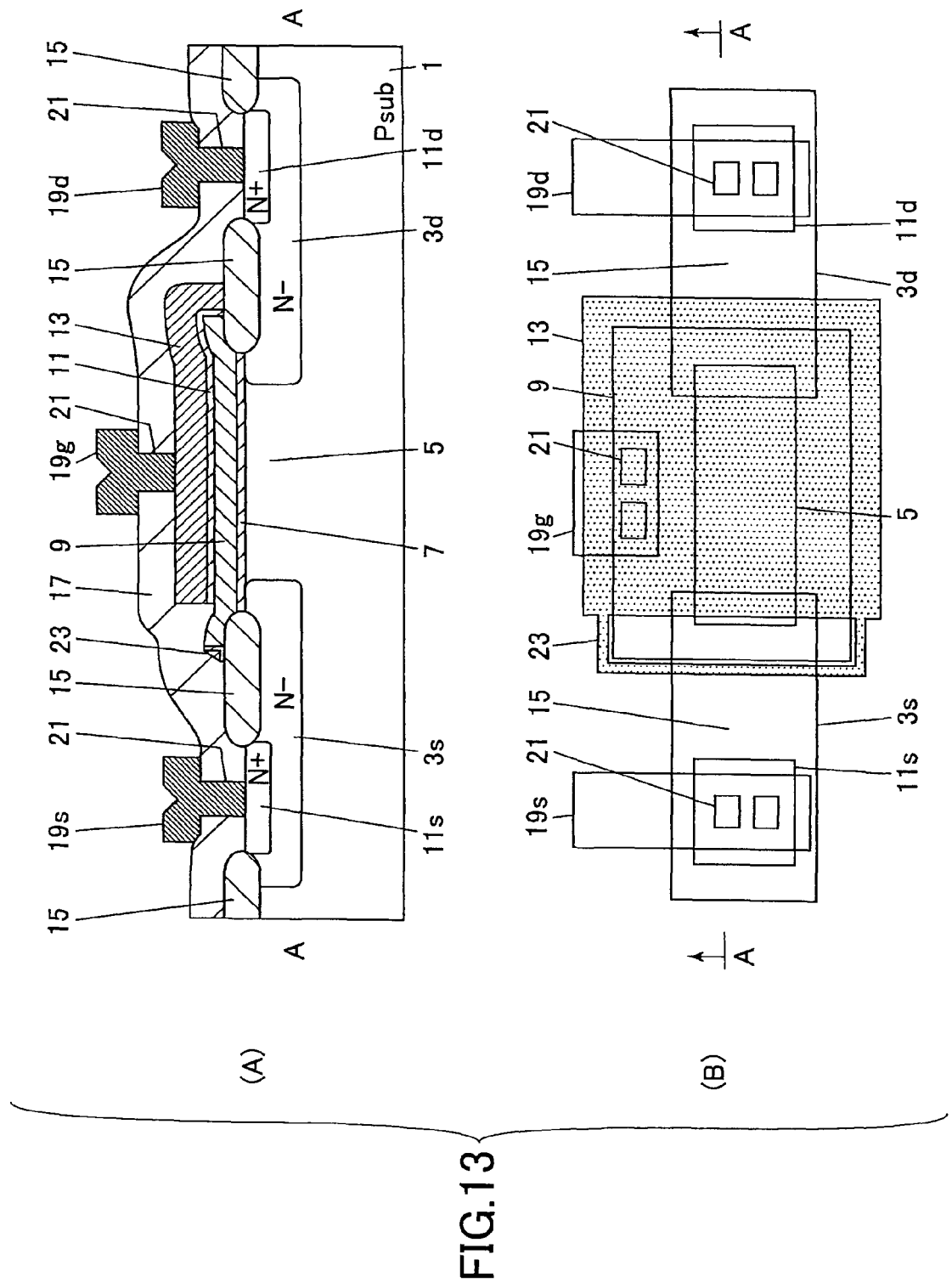
FIG. 13 schematically shows another embodiment, (A) showing a cross section and (B) showing a plan view.

While in the embodiments shown in FIGS. 11 and 12 all of the edges of the second gate electrode 13 as seen from above are disposed outside the edges of the first gate electrode 9, the edges of the second gate electrode 13 may be partly disposed outside the edges of the first gate electrode 9, as shown in FIG. 13. In FIG. 13(B), the second gate electrode 13 and the polycrystalline silicon processing residue 23 are indicated by a dotted pattern.

In the embodiment shown in FIG. 13, the capacitance value between the first gate electrode 9 and the second gate electrode 13 can be reduced compared with the embodiment shown in FIG. 11 while at the same time the development of the polycrystalline silicon processing residue 23 is permitted to some extent. Such a structure is effective in applications where there is not much fear of problems associated with the polycrystalline silicon processing residue 23 and where it is desired to reduce the voltage applied to the gate insulating film 7.

Figure 14:
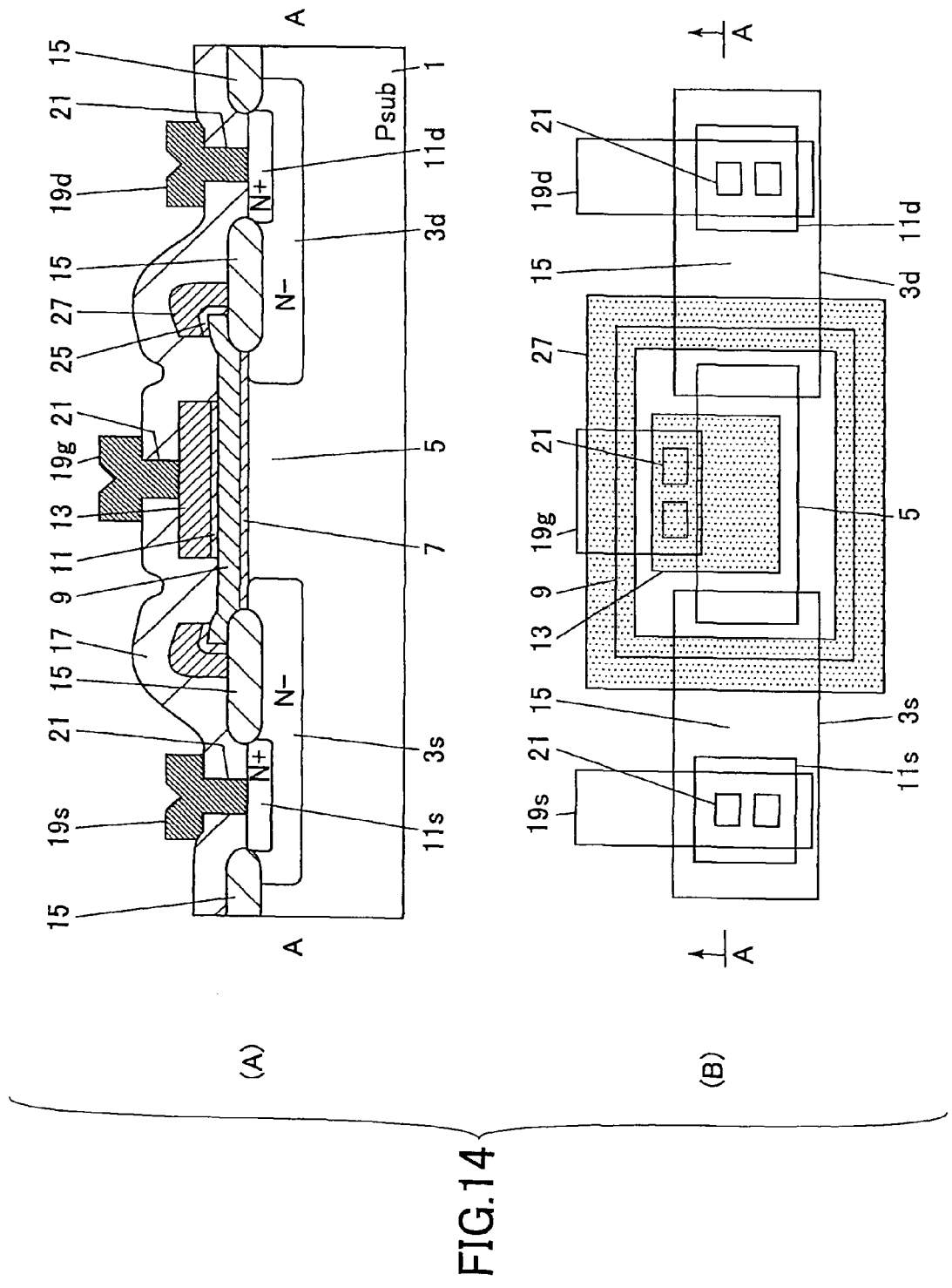
FIG. 14 schematically shows another embodiment, (A) showing a cross section and (B) showing a plan view.

FIG. 14 schematically shows another embodiment, (A) showing a cross section and (B) showing a plan view. The cross section of (A) is taken along line A-A of (B). In (B), portions invisible as seen from above are also indicated by solid lines. In (A), a gate wiring and a gate contact are also schematically shown. Portions that perform the same functions as those of the embodiment of FIG. 1 are designated with similar numerals.

In the present embodiment, as in the embodiment of FIG. 1, the second gate electrode 13 is formed only over the first gate electrode 9. As seen from above, the edges of the second gate electrode 13 are disposed spaced apart from the edges of the first gate electrode 9.

The present embodiment differs from the embodiment of FIG. 1 in that a polycrystalline silicon pattern 27 is formed that covers the edges and sides of the first gate electrode 9 via an insulating film pattern 25. The polycrystalline silicon pattern 27 is disposed spaced apart from the second gate electrode 13 and is formed of the same material as and simultaneously with the second gate electrode 13. Because the polycrystalline silicon pattern 27 is disposed spaced apart from the second gate electrode 13, they are insulated from each other. The insulating film pattern 25 is formed of the same material as and simultaneously with the gate electrode insulating film 11.

In this embodiment, the capacitance value between the first gate electrode 9 and the second gate electrode 13 can be reduced without developing the polycrystalline silicon processing residue 23 (see FIG. 10).

Figure 15:
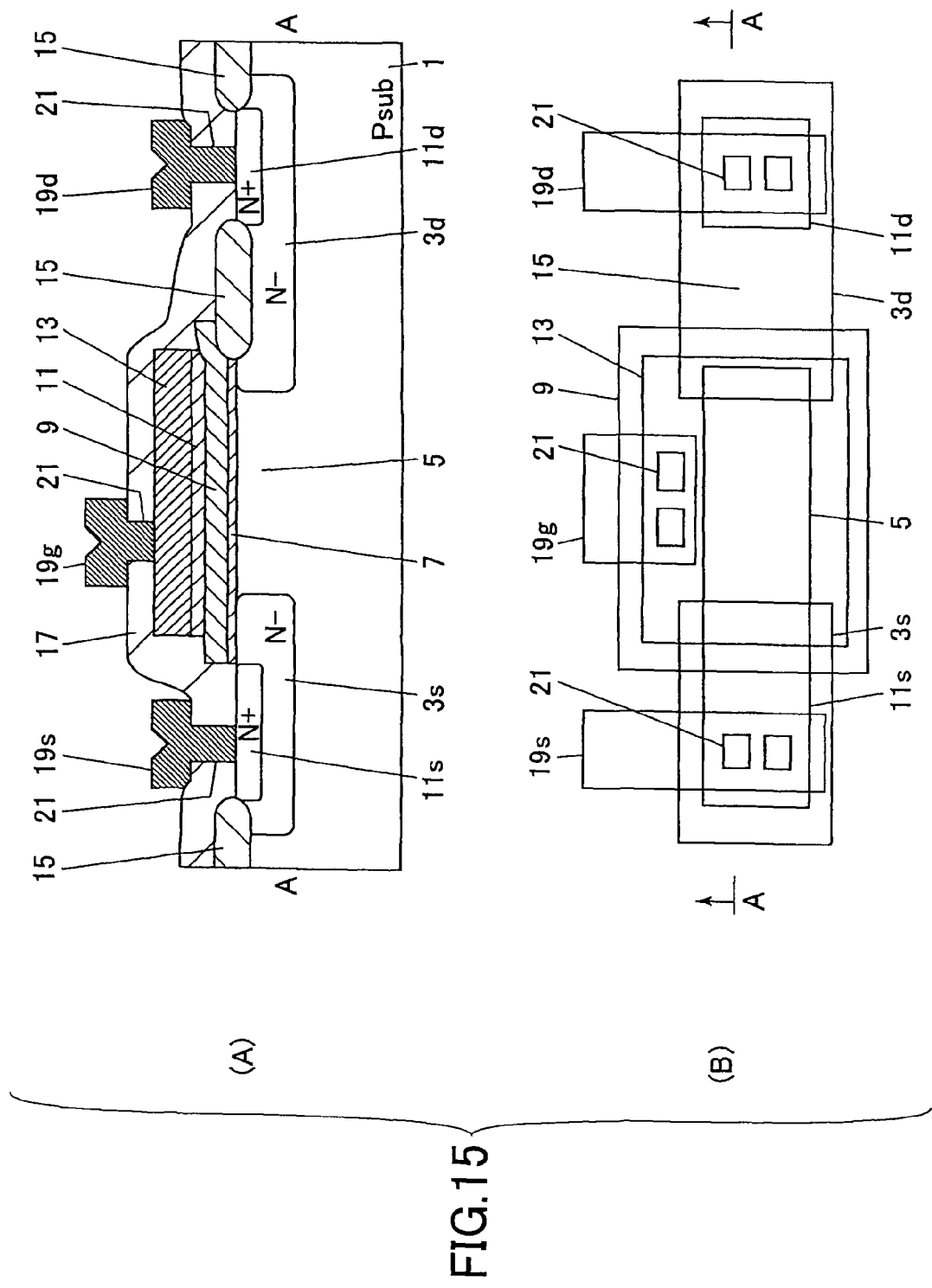
FIG. 15 schematically shows another embodiment, (A) showing a cross section and (B) showing a plan view.

While in the above embodiment the edges of the first gate electrode 9 on the sides of both the drain region and the source region are disposed over the LOCOS oxide films 15, the edges of the first gate electrode 9 on the side of the drain region alone may be disposed over the LOCOS oxide film 15, as shown in FIG. 15.

Figure 16:
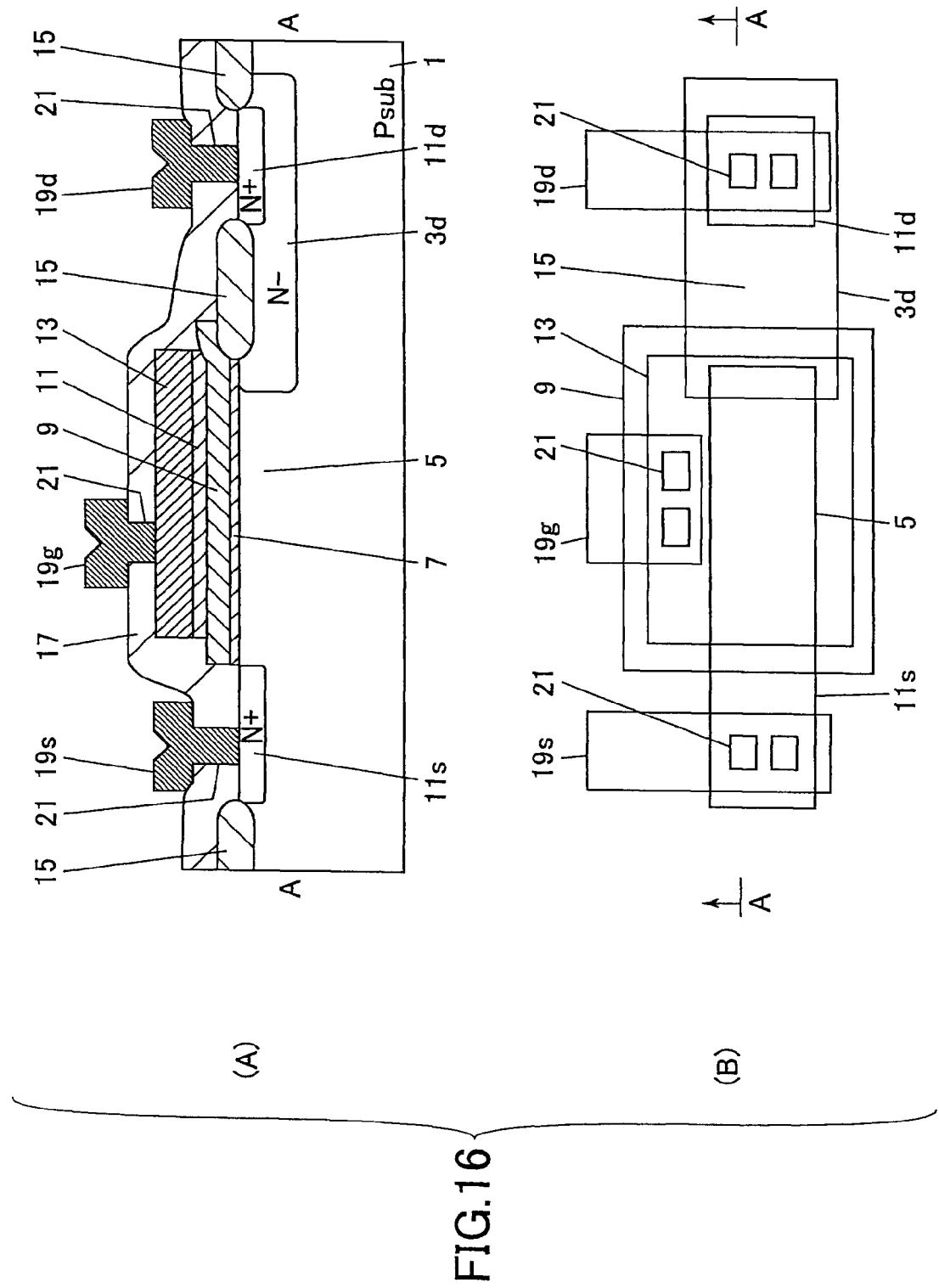
FIG. 16 schematically shows another embodiment, (A) showing a cross section and (B) showing a plan view.

Furthermore, while in the above embodiment both the drain region and the source region comprise a double diffusion structure, the drain region alone may comprise the double diffusion structure, as shown in FIG. 16.

The embodiments shown in FIGS. 9 through 16 can be formed by modifying the layout pattern (CAD data for photomasks) used in the exemplary manufacturing process described with reference to FIGS. 1 through 7.

If plural LOCOS offset transistors of a conventional structure for multiple gate voltages are mounted on a single semiconductor substrate in a hybrid manner, multiple problems arise.

Figure 47:
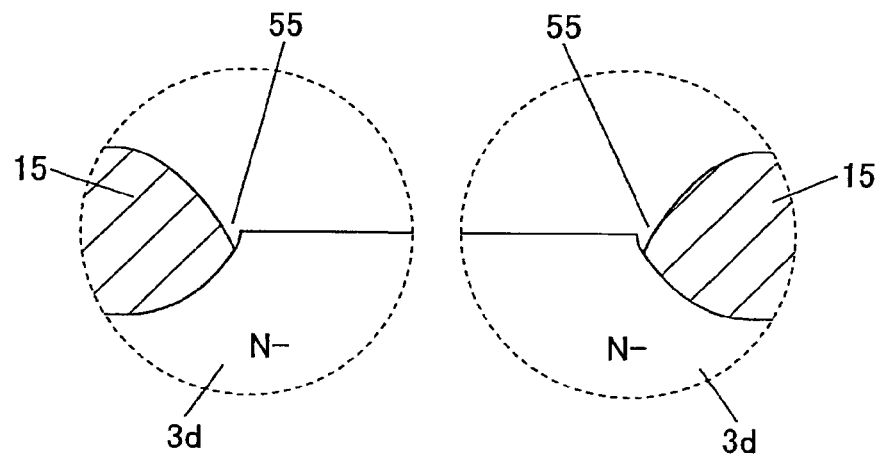
FIG. 47 shows an enlarged cross section of portions of FIG. 46 encircled by broken lines.
Figure 49:
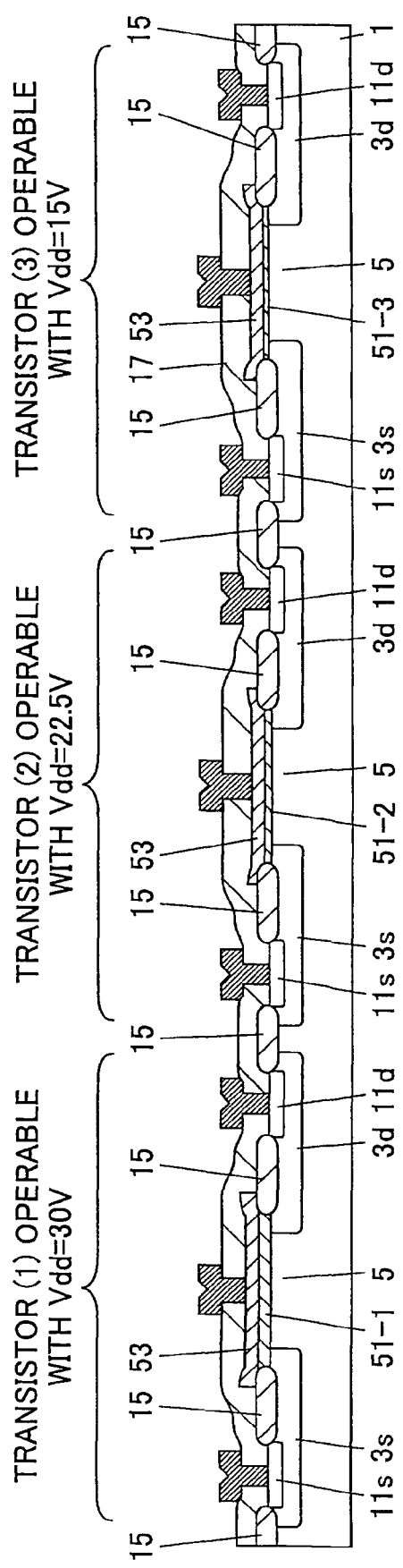
FIG. 49 schematically shows a cross section of a semiconductor substrate on which three types of LOCOS offset transistors of a conventional structure are mounted in a hybrid manner, the LOCOS offset transistors being associated with three different gate voltage values.

For example, as shown in FIG. 49, when three types of LOCOS offset transistors corresponding to three gate voltage values are mounted in a hybrid manner, it has been necessary to make the film thickness of gate insulating films 51-1, 51-2, and 51-3 different for each of the LOCOS offset transistors. Specifically, in a transistor (1) that is operable with a gate voltage Vdd=30 V, the film thickness of the gate insulating film 51-1 may be 80 nm; in a transistor (2) that is operable with a gate voltage Vdd=22.5 V, the film thickness of the gate insulating film 51-2 may be 50 nm; and in a transistor (3) that is operable with a gate voltage Vdd=15 V, the film thickness of the gate insulating film 51-3 may be 30 nm. Thus, it has been necessary to adapt the gate insulating film to each voltage band. Fabricating such gate insulating films of three different film thicknesses on a single semiconductor substrate is thus associated with a number of problems to be solved, including the problem of extension of process flow time; the problem of an increase in the number of mask sets to be prepared; and the aforementioned problem of a decrease in the field insulating film (see FIG. 47). For more details of such problems, reference should be made to Patent Document 3.

Figure 17:
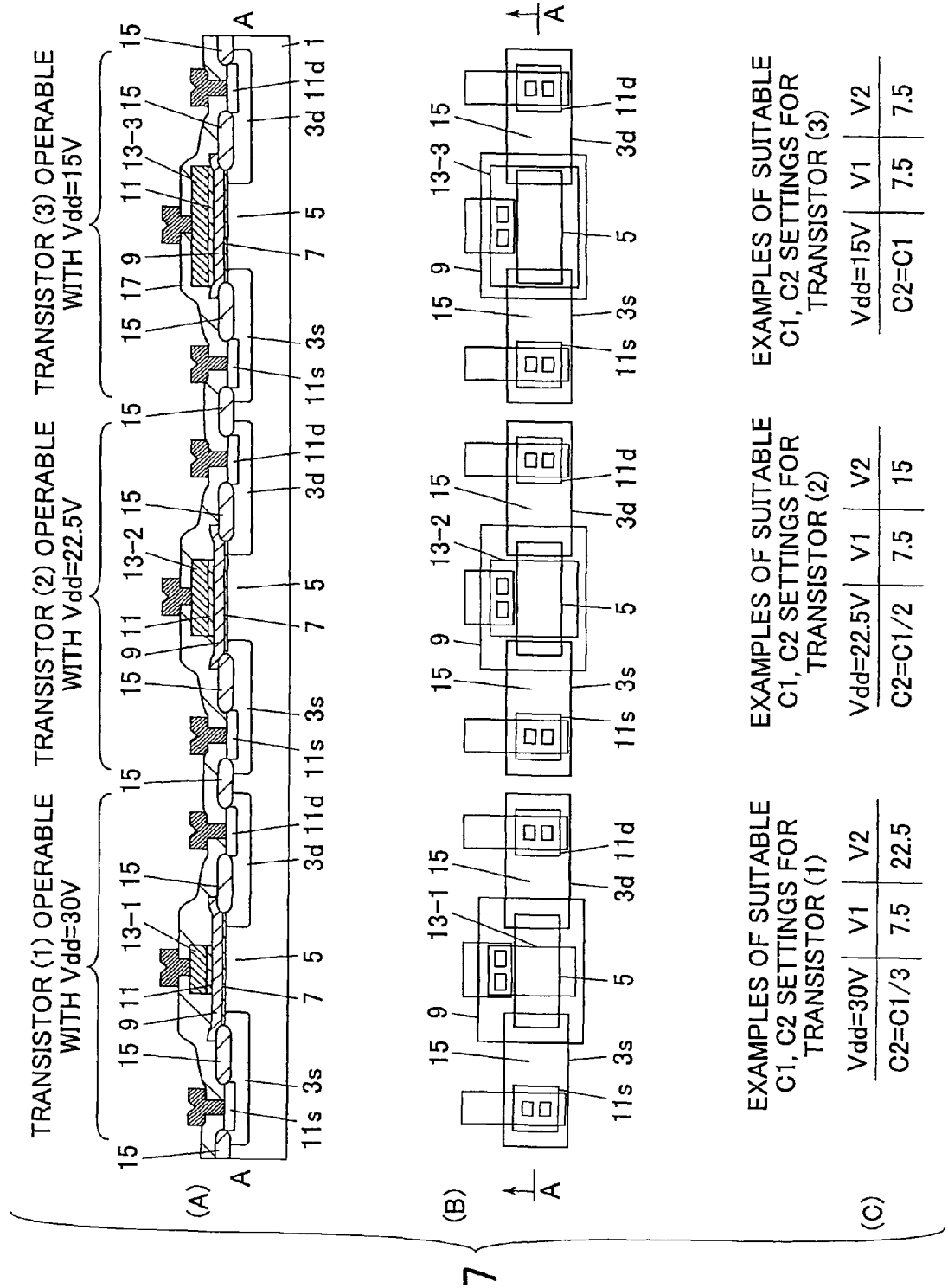
FIG. 17 schematically shows another embodiment, (A) showing a cross section, (B) showing a plan view, and (C) showing tables of exemplary settings of individual transistors relative to gate voltages.

On the other hand, in the LOCOS offset transistor according to the present invention, the voltage applied to the gate insulating film can be controlled by adjusting the capacitance value between the semiconductor substrate and the first gate electrode and the capacitance value between the first gate electrode and the second gate electrode. Thus, plural types of LOCOS offset transistors associated with plural gate voltage values, i.e., different operating voltage bands, can be mounted on the same semiconductor substrate in a hybrid manner without having to vary the gate insulating film thickness from one transistor to another; i.e., with the individual gate insulating films having the same film thickness. With reference to FIG. 17, an embodiment is described in which three types of LOCOS offset transistors having different operating voltage bands are mounted on the same semiconductor substrate in a hybrid manner.

FIG. 17 schematically shows the other embodiment, (A) showing a cross section, (B) showing a plan view, and (C) showing tables of exemplary settings of each transistor with respect to various gate voltages. The cross section in (A) is taken along line A-A of (B). In (B), portions that are invisible as seen from above are also indicated by solid lines. In (A), a gate wiring and a gate contact are also schematically shown. Portions corresponding to the parts shown in FIG. 1 are designated with similar numerals.

In the present embodiment, a transistor (1) that is operable with a gate voltage Vdd=30 V, a transistor (2) that is operable with a gate voltage Vdd=22.5 V, and a transistor (3) that is operable with a gate voltage Vdd=15 V are mounted on the same semiconductor substrate 1.

In these transistors (1), (2), and (3), the respective second gate electrodes 13-1, 13-2, and 13-3 have different layout areas. With regard to the other portions, such as the P-type well region formed in the semiconductor substrate 1, the gate insulating film 7, the first gate electrode 9, and the gate electrode insulating film 11, the three transistors (1), (2), and (3) are identical in terms of shape, impurity concentration, and film thickness. The planar shape of the gate electrode insulating film 11 differs among the transistors (1), (2), and (3), corresponding to the difference in planar shape among the second gate electrodes 13-1, 13-2, and 13-3.

Specifically, among the transistors (1), (2), and (3), a capacitance value C1 between the first gate electrode 9 and the semiconductor substrate 1 (P-type well region) is the same while a capacitance value C2 between the first gate electrode 9 and the second gate electrode 13 is different. More specifically, in the transistor (1) that is operable with gate voltage Vdd=30 V, C2=C1/3; in the transistor (2) that is operable with gate voltage Vdd=22.5 V, C2=C1/2; and in the transistor (3) that is operable with gate voltage Vdd=15 V, C2=C1. Thus, in accordance with the aforementioned calculation equations shown in FIG. 8, the voltage applied to the gate insulating film 7 is 7.5 V for all of the three transistors (1), (2), and (3). Thus, using the gate insulating film 7 of the same film thickness, the same material, and the same fabrication period, a one-chip LSI can be obtained that can handle three different operating voltage bands of the applied voltage, namely, 30 V, 22.5 V, and 15 V.

Furthermore, since the three transistors (1), (2), and (3) can be formed by merely varying the layout area (CAD data) for the second gate electrode 13, they can be formed by the manufacturing process described with reference to FIGS. 1 through 7. Thus, the problems described with reference to FIG. 49, such as the problem of extension of process flow time, the problem of an increase in the number of mask sets that need to be prepared, and the problem of a decrease in the field insulating film, can all be overcome.

In the embodiment shown in FIG. 17, the transistors (1), (2), and (3) are formed by varying only the layout area of the second gate electrode 13-1, 13-2, and 13-3 of the three transistors (1), (2), and (3). However, this is not the only method of varying the operating voltage bands of the LOCOS offset transistors. For example, the operating voltage bands of the LOCOS offset transistors may be made different by varying at least either the layout area, the film thickness, or the material of the gate insulating film 7, the first gate electrode 9, the gate electrode insulating film 11, and the first gate electrode 13 from one another. However, in the light of the aforementioned problems described with reference to FIG. 49, it is advantageous to vary the layout area alone of the second gate electrode among the plural LOCOS offset transistors so as to vary the respective operating voltage bands.

While in the embodiment shown in FIG. 17 the three transistors (1), (2), and (3) are all adapted to high voltage of 15 V and above, the LOCOS offset transistors according to the present invention can also be applied to a transistor that is operable with a low voltage of 2.5 V, for example. Thus, one, two, or all of the transistors (1), (2), and (3) may comprise transistors that are operable with low, mutually different operating voltage bands.

While in the embodiment shown in FIG. 17 the transistors (1), (2), and (3) mounted on the same semiconductor substrate in a hybrid manner are all LOCOS offset transistors, it is also possible to mount a LOCOS offset transistor according to the present invention and a conventional MOS transistor on the same semiconductor substrate in a hybrid manner. Such an embodiment is described with reference to FIG. 18.

Figure 18:
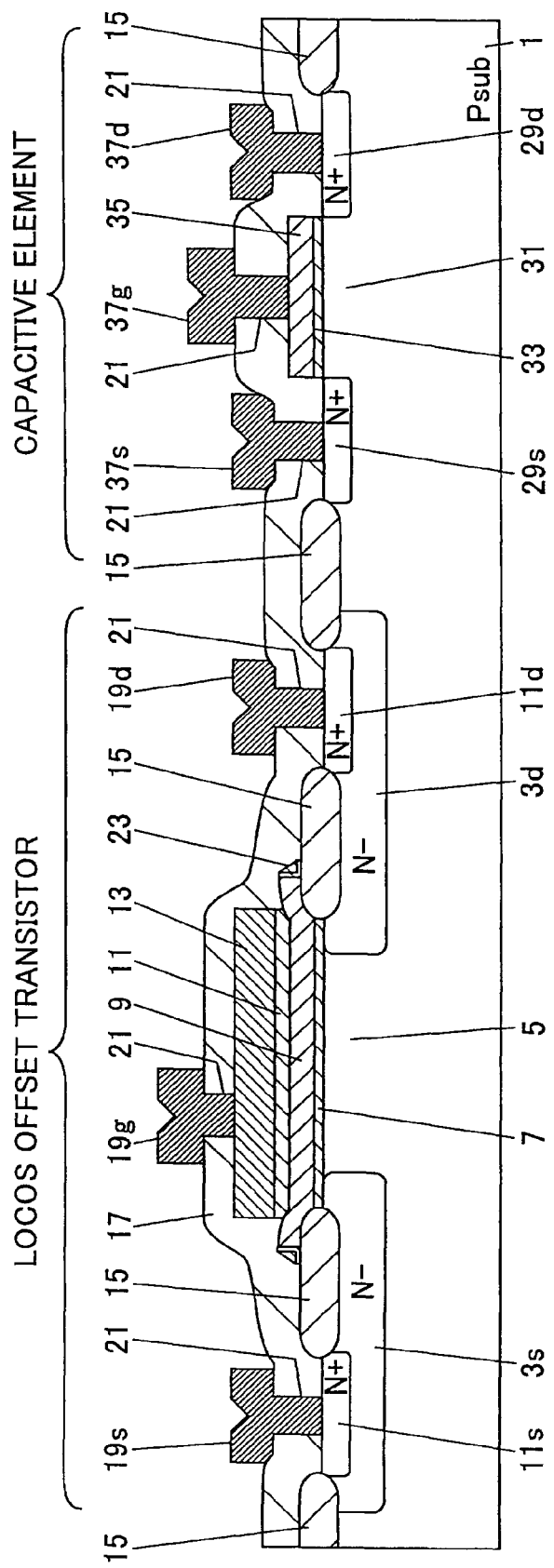
FIG. 18 schematically shows a cross section of another embodiment.
Figure 19:
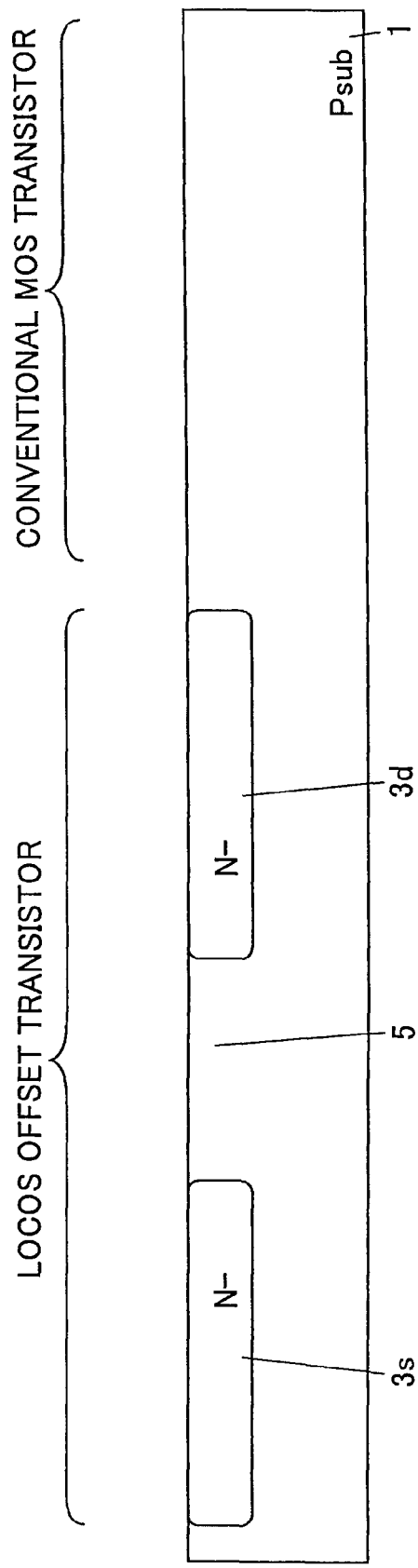
FIG. 19 shows a cross section illustrating an initial step of a manufacturing process for a LOCOS offset transistor and a conventional MOS transistor shown in FIG. 18.

FIG. 18 shows a cross section of the other embodiment. Portions that perform the same functions as those of the portions shown in FIG. 1 are designated with similar numerals. Since the structure of the LOCOS offset transistor is the same as that of the embodiment of FIG. 1, its description is omitted.

On a semiconductor substrate 1, a conventional MOS transistor is formed in a different region from the region where the LOCOS offset transistor is formed.

The conventional MOS transistor includes an N+ drain region 29*d* and an N+ source region 29*s* that are formed spaced apart from each other in a P-type well (not shown), which is formed on the surface side of the semiconductor substrate 1. The semiconductor substrate 1 between the N+ drain region 29*d* and the N+ source region 29*s* provides a channel region 31. Over the channel region 31, a gate insulating film 33 is located, which is formed simultaneously with a gate insulating film 33 of the LOCOS offset transistor. The gate insulating film 33 may be made of a silicon oxide film with a film thickness of 20 nm.

Over the gate insulating film 33, a gate electrode 35 is formed. The gate electrode 35 is formed of the same material as and simultaneously with the first gate electrode 9 of the LOCOS offset transistor.

Over the semiconductor substrate 1, a silicon oxide insulating film 17 is formed, covering the N+ drain region 29*d*, the N+ source region 29*s*, and the gate electrode 35. Over the silicon oxide insulating film 17, a gate wiring 37*g*, a drain wiring 37*d*, and a source wiring 37*s* are formed of a metal material, such as aluminum. Via connection holes 21 formed in the silicon oxide insulating film 17, the gate wiring 37*g* is connected to the gate electrode 35; the drain wiring 37*d* is connected to the N+ drain region 29*d*; and the source wiring 37*s* is connected to the N+ source region 29*s*.

FIGS. 19 through 24 show schematic cross sections illustrating an example of the manufacturing process for forming the LOCOS offset transistor and the conventional MOS transistor shown in FIG. 18. With reference to FIGS. 18 through 24, the manufacturing process is described.

After the P-type well region (not shown) is formed in the P-type semiconductor substrate 1, a resist pattern (not shown) is formed by a photomechanical technique. Using the pattern as a mask, phosphorus is ion-implanted under the conditions of an implantation energy of 100 KeV and a dose of $2.0 \times 10^{13}$ $cm^{-2}$. After the resist pattern is removed, the substrate is exposed to a nitrogen atmosphere at 1000° C. for 30 minutes, whereby the implanted phosphorus is diffused and activated, thus forming the N-drain region 3*d* and the N-source region 3*s* of low concentration (see FIG. 19).

Figure 20:
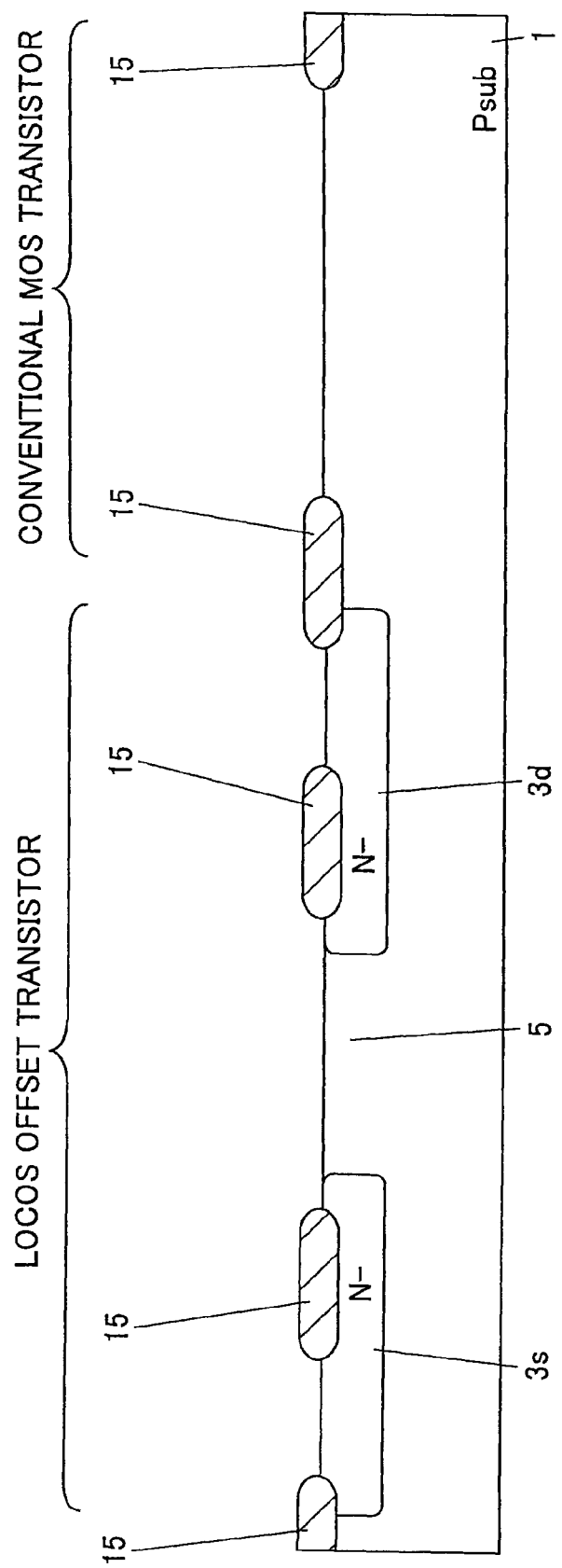
FIG. 20 shows a cross section of a subsequent step of the manufacturing process.
Figure 21:
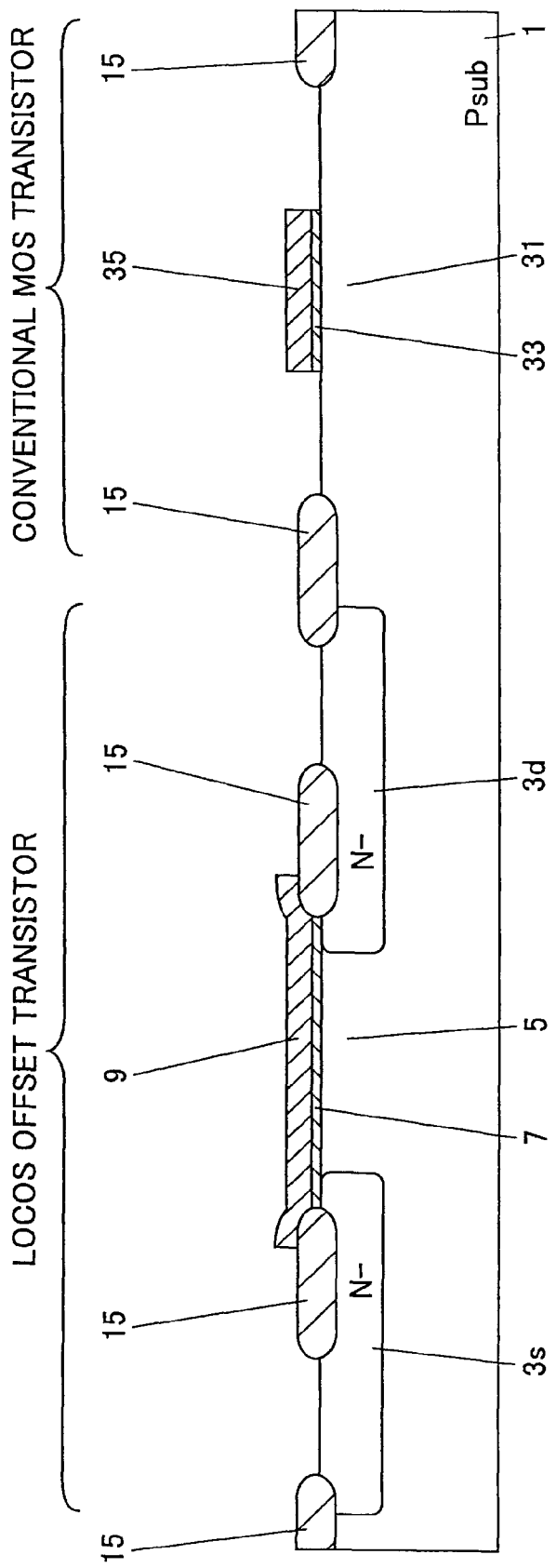
FIG. 21 shows a cross section of a subsequent step of the manufacturing process.
Figure 22:
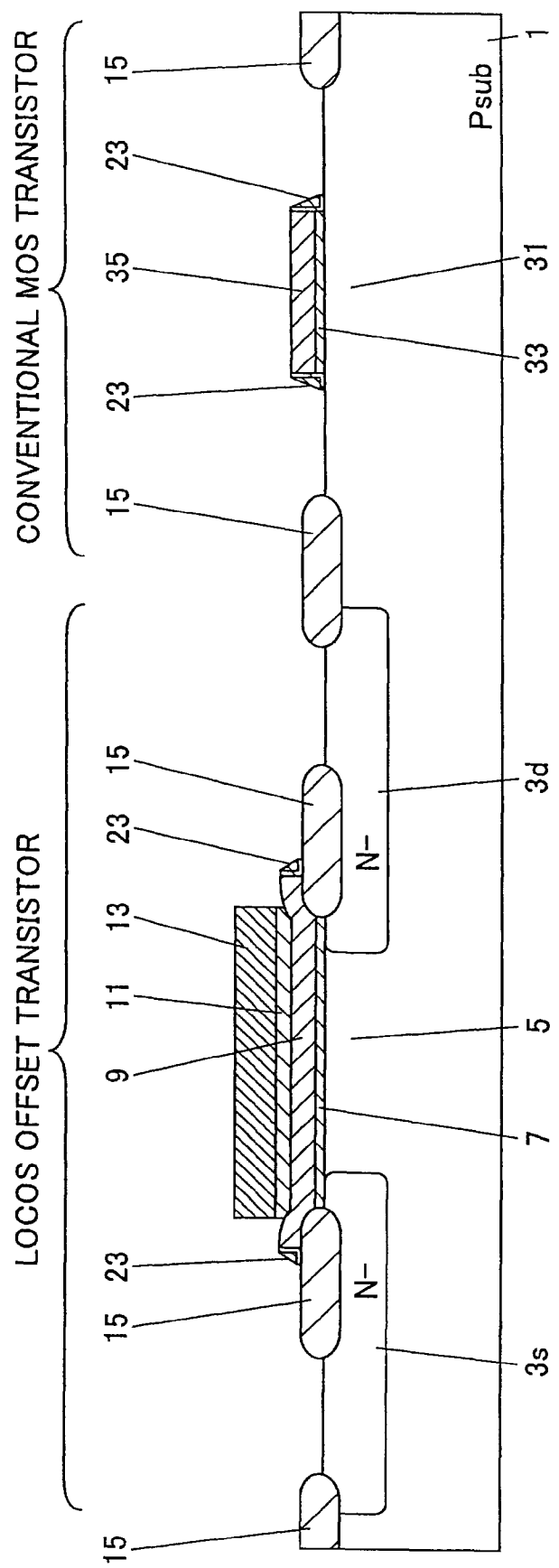
FIG. 22 shows a cross section of a subsequent step of the manufacturing process.
Figure 23:
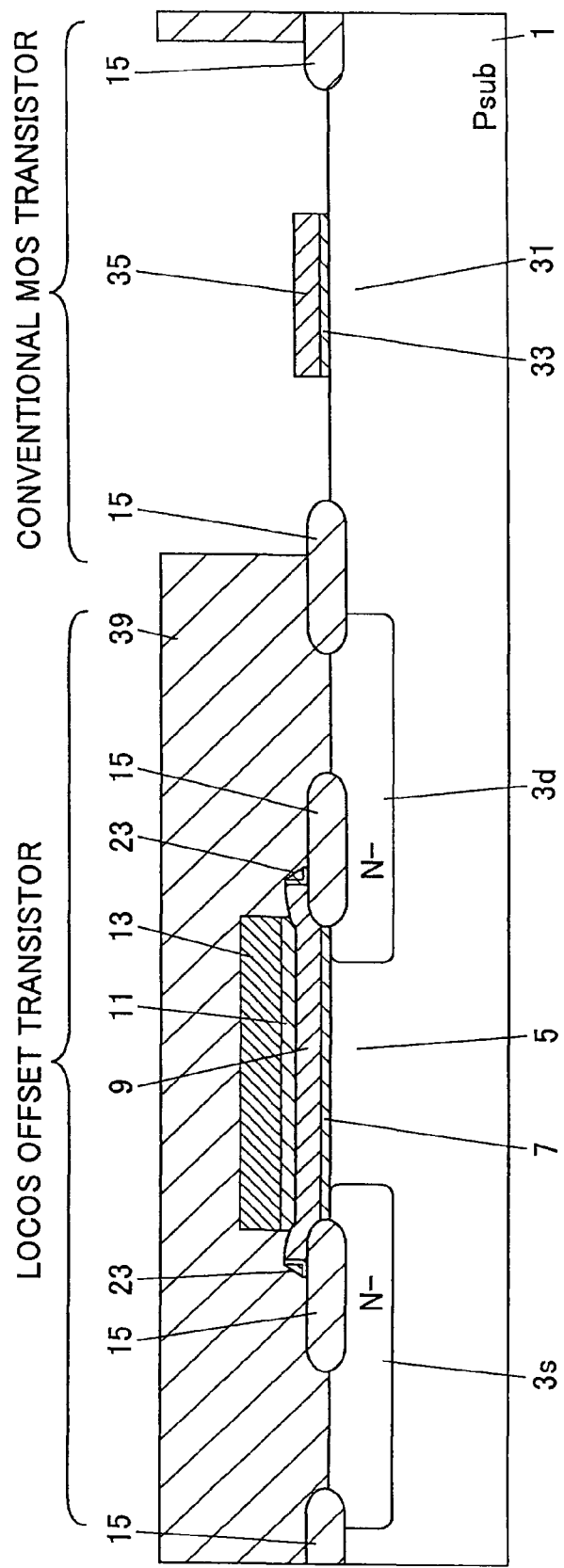
FIG. 23 shows a cross section of a subsequent step of the manufacturing process.
Figure 24:
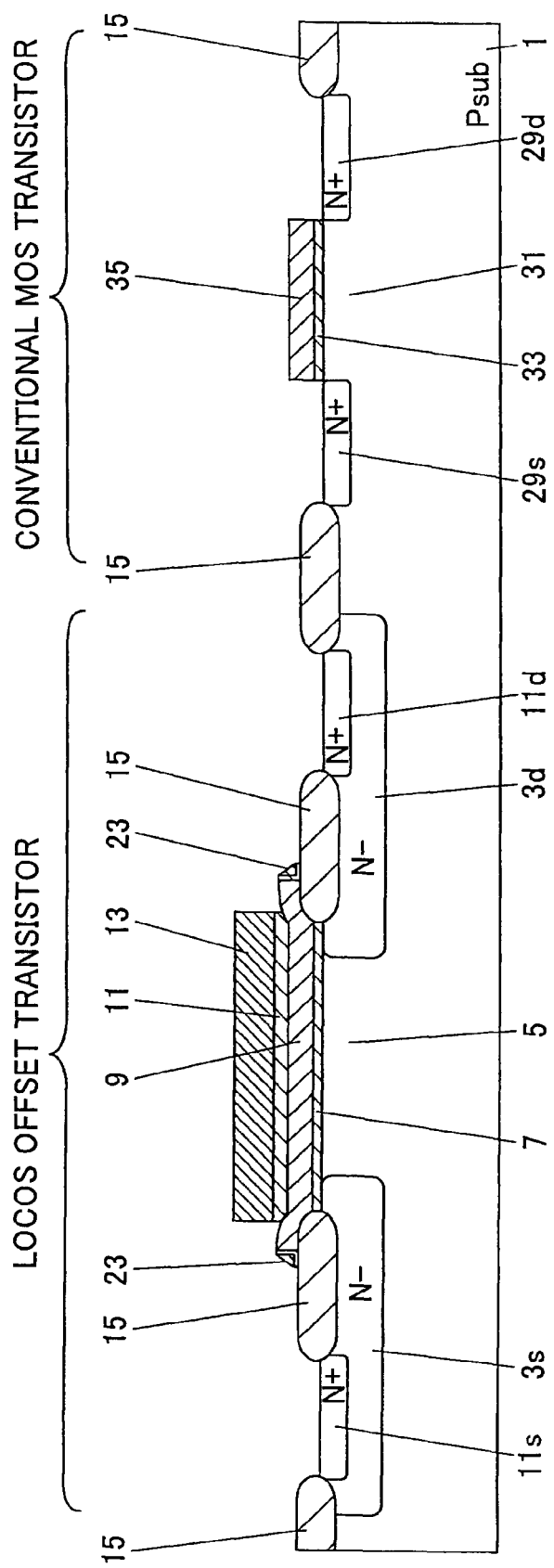
FIG. 24 shows a cross section of a subsequent step of the manufacturing process.

Using an existing isolation formation technique, the LOCOS oxide films 15 are formed to a film thickness of 500 nm (see FIG. 20).

After a silicon oxide film for the gate insulating films 7 and 33 is formed to a film thickness of 20 nm, a polycrystalline silicon film is successively deposited to a thickness of 300 nm. Then, a resist pattern is formed using a photomechanical technique. Using the pattern as a mask, the polycrystalline silicon film and the silicon oxide film are successively removed by an anisotropic dry etching technique, whereby the first gate electrode 9 and the gate electrode 35 are formed of the polycrystalline silicon film, the gate insulating film 7 is formed under the first gate electrode 9, and the gate insulating film 33 is formed under the gate electrode 35. Thereafter, the resist pattern is removed (see FIG. 21). The removal of the silicon oxide film by etching for forming the gate insulating films 7 and 33 may involve a wet etching technique.

After the gate electrode insulating film 11 is formed to a film thickness of 20 nm, a polycrystalline silicon film is successively deposited to a thickness of 300 nm. Using a photomechanical technique, a resist pattern is formed and, using it as a mask, the polycrystalline silicon film and the gate electrode insulating film 11 are successively removed by an anisotropic dry etching technique, whereby the second gate electrode 13 of the polycrystalline silicon film is formed, and the gate electrode insulating film 11 is formed under the second gate electrode 13. At this time, the polycrystalline silicon processing residue 23 is formed at the sides of the first gate electrode 9 and the gate electrode 35. Thereafter, the resist pattern is removed (see FIG. 22). The removal of the gate electrode insulating film 11 may involve a wet etching technique.

A resist pattern 39 that has openings in regions for forming the conventional MOS transistor is formed. Using the resist pattern 39 as a mask, the polycrystalline silicon processing residue 23 at the sides of the gate electrode 35 is removed by an isotropic etching technique, for example (see FIG. 23).

After a resist pattern having openings at regions for forming the LOCOS offset transistor and the conventional MOS transistor is formed, arsenic is ion-implanted under the conditions of an implantation energy of 30 KeV and a dose of $5.0 \times 10^{15}$ cm$^{-2}$. After the resist pattern is removed, the substrate is exposed to a nitrogen atmosphere at 900° C. for 30 minutes, whereby the implanted arsenic is diffused and activated, forming the N+ drain region 11d, the N+ source region 11s, the N+ drain region 29d, and the N+ source region 29s of high concentration (see FIG. 24).

A silicon oxide insulating film 17 is deposited over the entire surface of the semiconductor substrate 1 to a film thickness of 1000 nm. After a resist pattern is formed, the silicon oxide insulating film 17 is removed by etching at predetermined positions, using the resist pattern as a mask, whereby connection holes 21 are formed at positions corresponding to the N+ drain region 11d, the N+ source region 11s, the second gate electrode 13, the N+ drain region 29d, the N+ source region 29s, and the gate electrode 35. Over the silicon oxide insulating film 17, an aluminum metal film, for example, is formed and then patterned, whereby the gate wiring 19g, the drain wiring 19d, the source wiring 19s, the gate wiring 37g, the drain wiring 37d, and the source wiring 37s are formed (see FIG. 18).

In this embodiment, the voltage applied to the gate insulating film 7 as regards the LOCOS offset transistor can be reduced by dividing the gate voltage as shown in FIG. 8. Thus, the gate insulating film 7 and the gate insulating film 33 of the conventional transistor can be formed of the same material, with the same film thickness, and simultaneously. Namely, the LOCOS offset transistor that can handle high voltage can be formed using the gate insulating film 7 that has the same characteristics as the gate insulating film 33 of the conventional transistor.

Furthermore, in the present embodiment, since the gate insulating film 7 of the LOCOS offset transistor and the gate insulating film 33 of the conventional transistor are simultaneously formed, process flow can be simplified when mounting the LOCOS offset transistor and the conventional transistor on the same semiconductor substrate in a hybrid manner, thus overcoming the aforementioned problem of extension of process flow time. In addition, since the first gate electrode 9 of the LOCOS offset transistor and the gate electrode 35 of the conventional transistor are simultaneously formed, process flow can be simplified.

Figure 25:
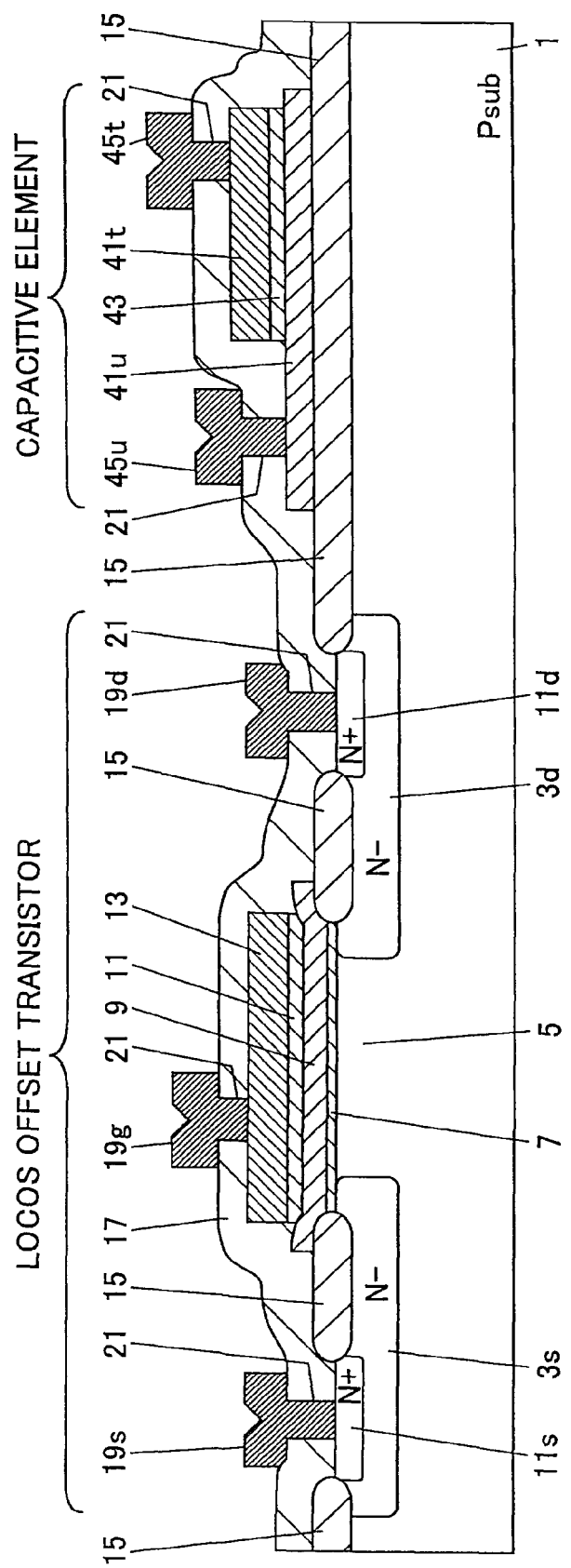
FIG. 25 schematically shows a cross section of another embodiment.
Figure 26:
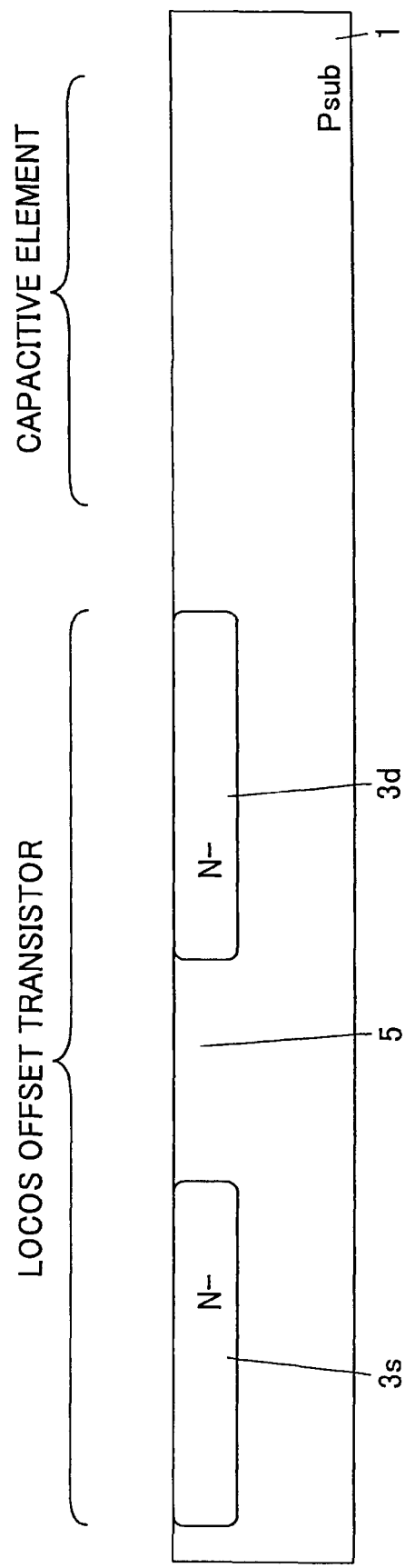
FIG. 26 shows a cross section illustrating an initial step of a process of manufacturing a LOCOS offset transistor and a capacitive element shown in FIG. 25.

FIG. 25 shows a cross section of yet another embodiment of the invention. In the present embodiment, at a different position on the semiconductor substrate 1 from the region where a LOCOS offset transistor is formed, a capacitive element is formed. The capacitive element comprises a first capacitive element electrode formed of the same material as and simultaneously with the first gate electrode, and a second capacitive element electrode. The second capacitive element, which is disposed over the first capacitive element electrode via an insulating film, is formed of the same material as and simultaneously with the second gate electrode. In this figure, portions that perform the same functions as those of the portions shown in FIG. 1 are designated with similar numerals. Since the structure of the LOCOS offset transistor is identical to that of the embodiment shown in FIG. 1, its description is omitted.

The capacitive element is formed, via LOCOS oxide films 15, at a position on the semiconductor substrate 1 that is different from the region where the LOCOS offset transistor is formed. The capacitive element includes a first capacitive element electrode 41u formed over the LOCOS oxide film 15, and a second capacitive element electrode 41t formed over the first capacitive element electrode 41u via a capacitive element electrode insulating film 43. The first capacitive element electrode 41u is formed of the same material as and simultaneously with the first gate electrode 9. The capacitive element electrode insulating film 43 is formed of the same material as and simultaneously with the gate electrode insulating film 11. The second capacitive element electrode 41t is formed of the same material as and simultaneously with the second gate electrode 13.

The silicon oxide insulating film 17 covers the first capacitive element electrode 41u and the second capacitive element electrode 41t. On the silicon oxide insulating film 17, a first capacitive element electrode wiring 45u and a second capacitive element electrode wiring 45t are formed of the same material as and simultaneously with the gate wiring 19g, the drain wiring 19d, and the source wiring 19s. Via connection holes 21 formed in the silicon oxide insulating film 17, the first capacitive element electrode wiring 45u is connected to the first capacitive element electrode 41u, and the second capacitive element electrode wiring 45t is connected to the second capacitive element electrode 41t.

FIGS. 26 through 31 show cross sections illustrating an example of a process of manufacturing the LOCOS offset transistor and the capacitive element shown in FIG. 25. With reference to FIGS. 25 through 31, the manufacturing process is described.

After a P-type well region, which is not shown, is formed in the P-type semiconductor substrate 1, a resist pattern (not shown) is formed by a photomechanical technique. Using the pattern as a mask, phosphorus is ion-implanted under the conditions of an implantation energy of 100 KeV and a dose of $2.0 \times 10^{13}$ cm$^{-2}$. After the resist pattern is removed, the substrate is exposed to a nitrogen atmosphere of 1000° C. and for 30 minutes, whereby the implanted phosphorus is diffused and activated, forming the N-drain region 3d and the N-source region 3s of low concentration (see FIG. 26).

Figure 27:
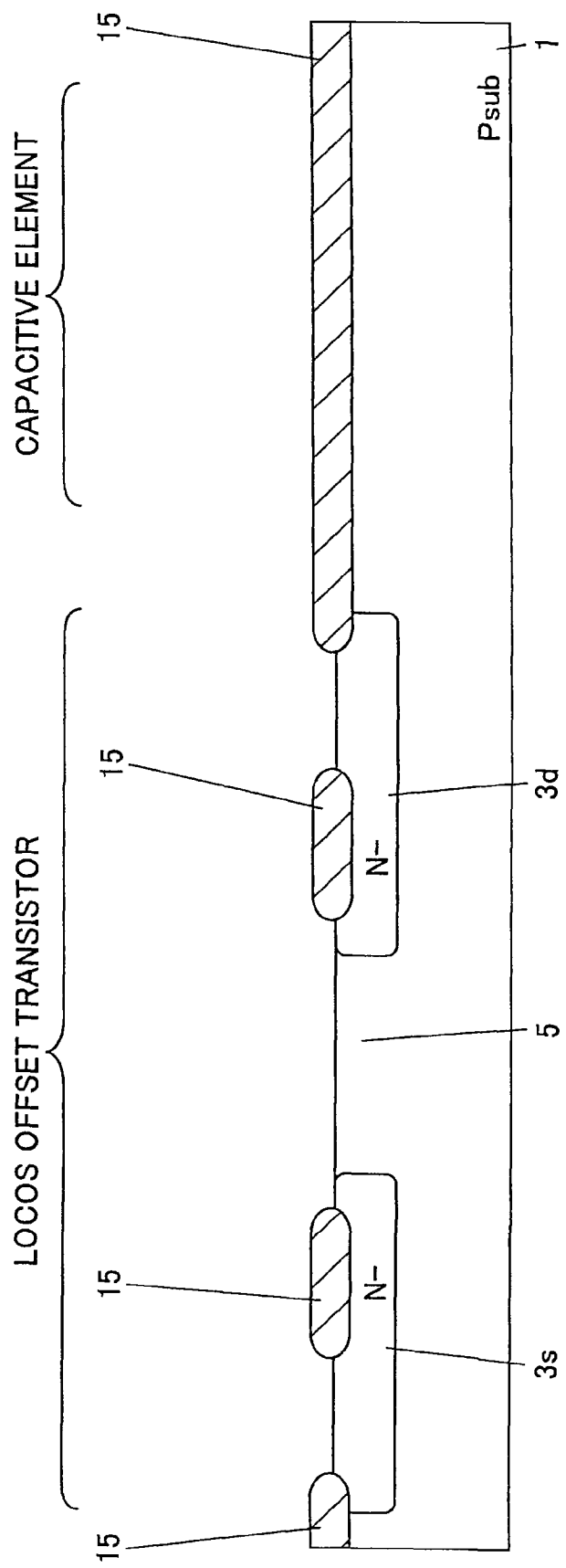
FIG. 27 shows a cross section of a subsequent step of the manufacturing process.
Figure 28:
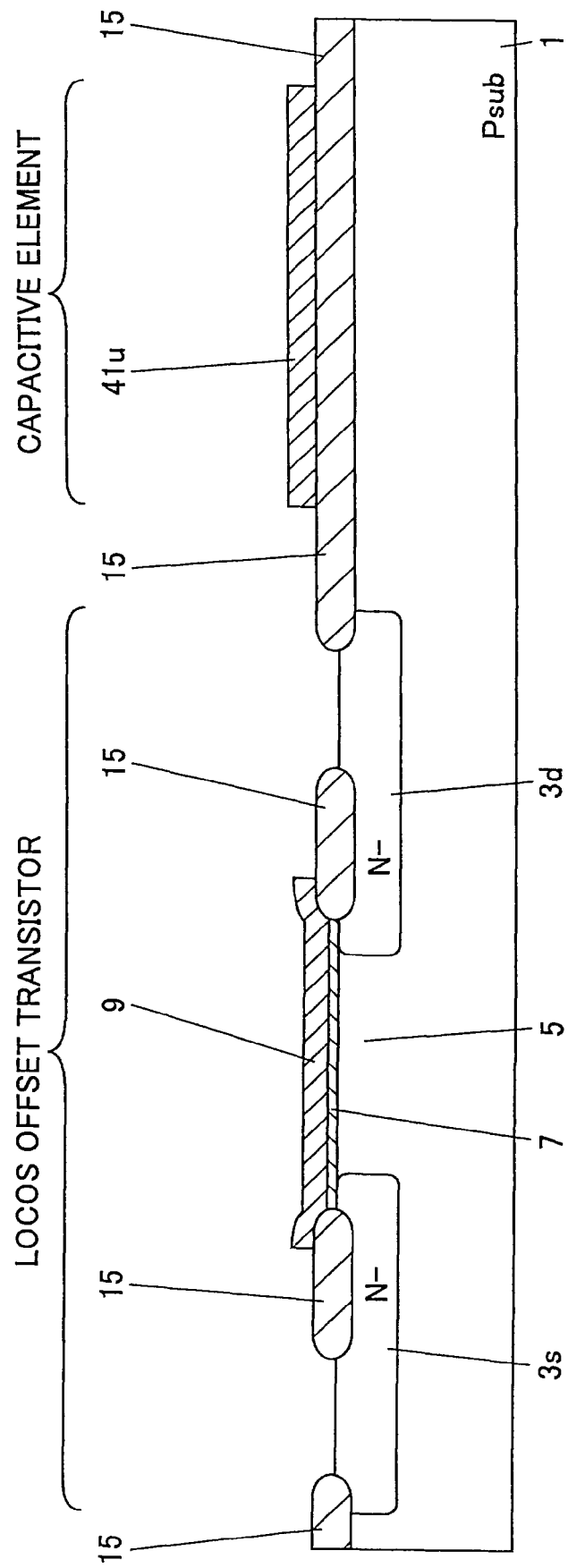
FIG. 28 shows a cross section of a subsequent step of the manufacturing process.
Figure 29:
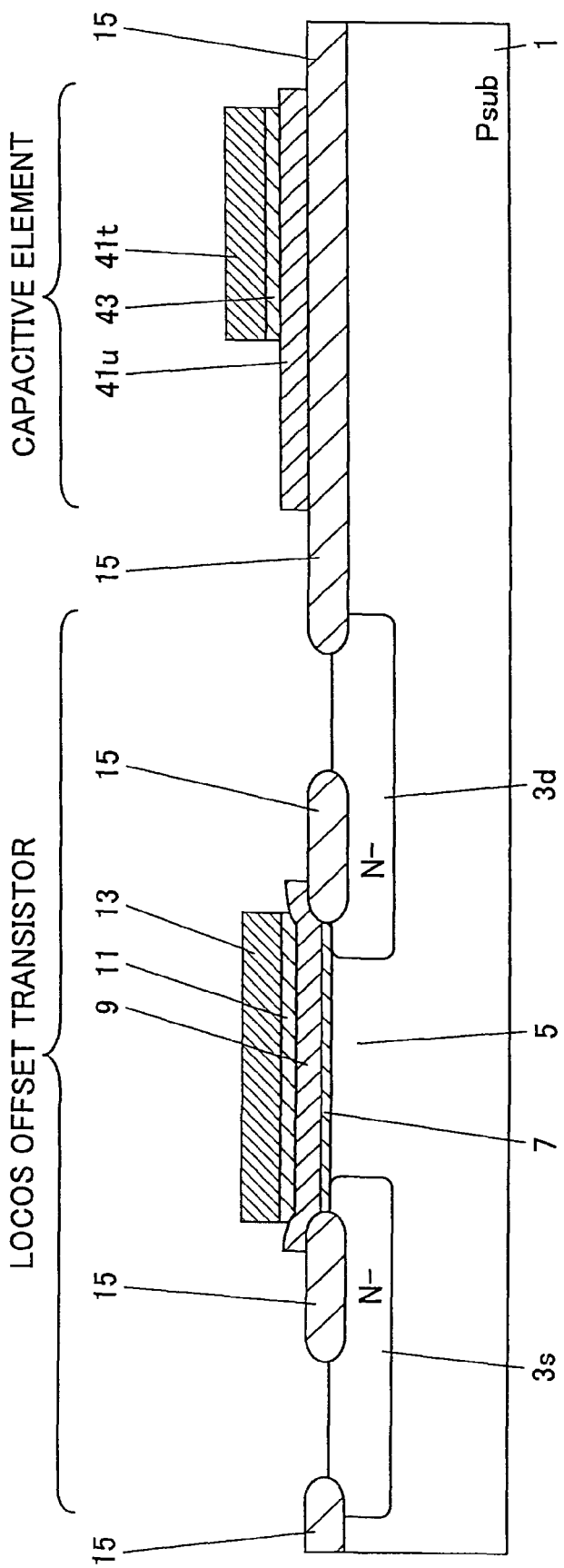
FIG. 29 shows a cross section of a subsequent step of the manufacturing process.
Figure 30:
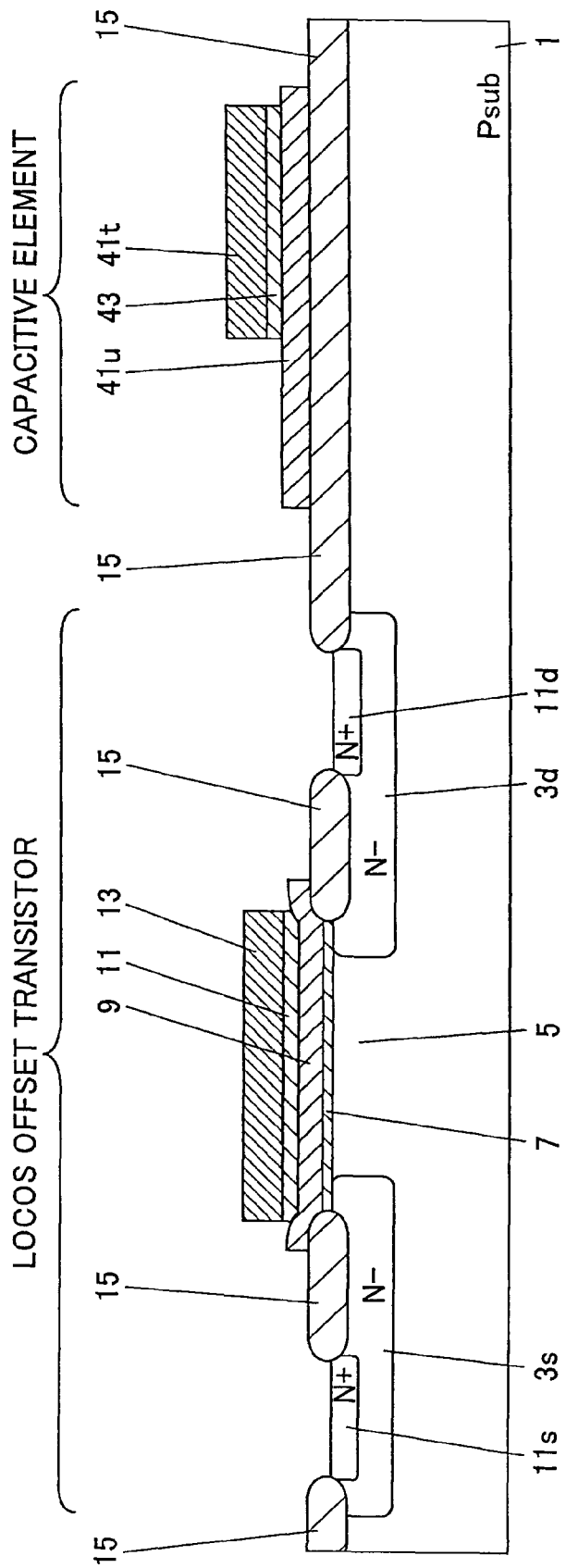
FIG. 30 shows a cross section of a subsequent step of the manufacturing process.
Figure 31:
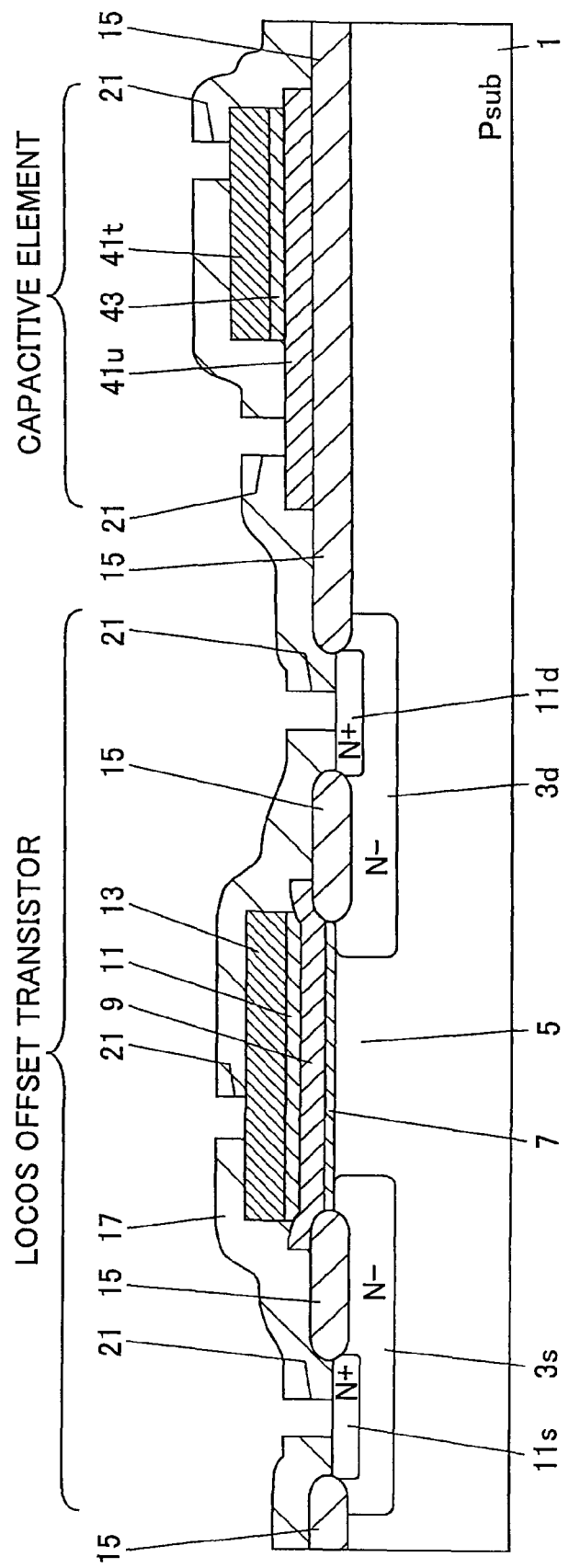
FIG. 31 shows a cross section of a subsequent step of the manufacturing process.
Figure 32:
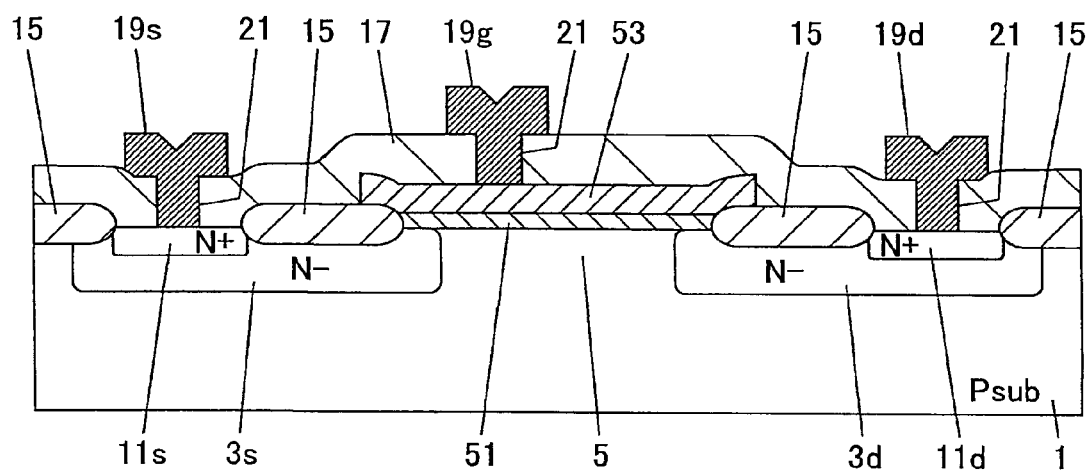
FIG. 32 schematically shows a cross section of a conventional LOCOS offset transistor.
Figure 33:
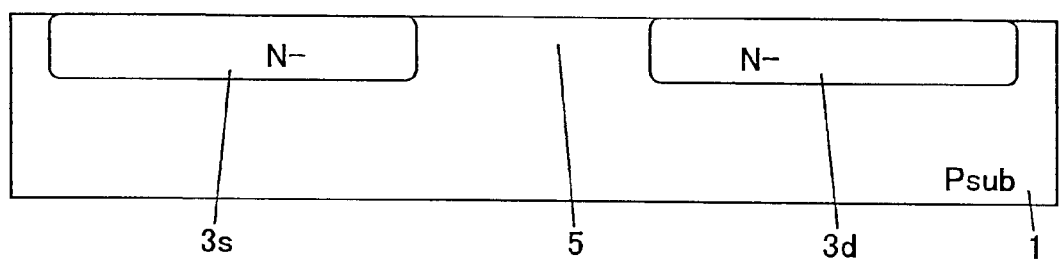
FIG. 33 shows a cross section illustrating an initial step of a process of manufacturing the conventional LOCOS offset transistor shown in FIG. 32.
Figure 34:
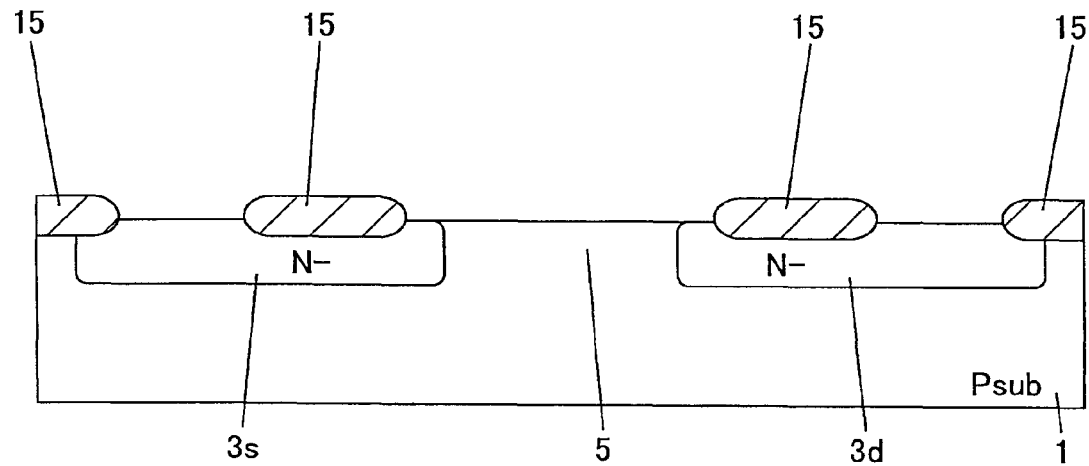
FIG. 34 shows a cross section illustrating a subsequent step of the manufacturing process.
Figure 35:
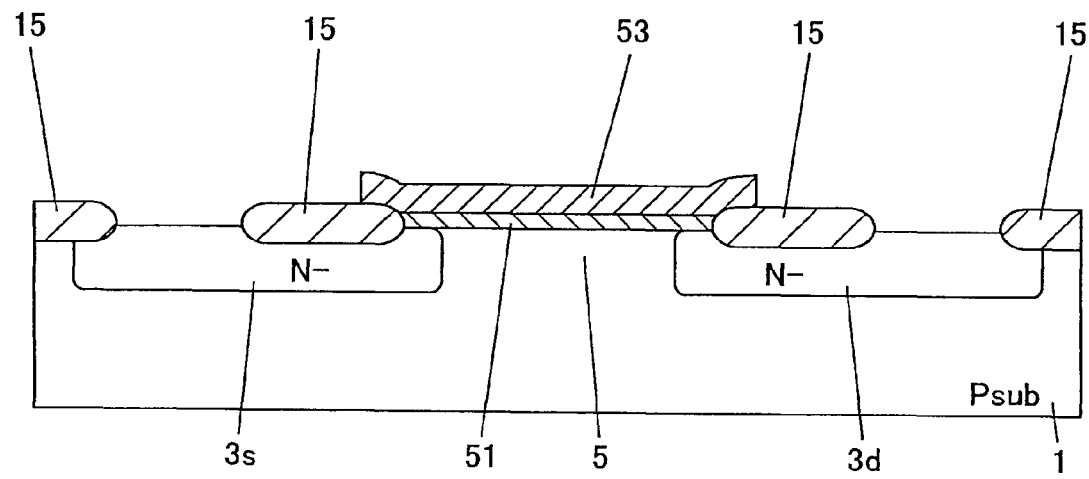
FIG. 35 shows a cross section of a subsequent step of the manufacturing process.
Figure 36:
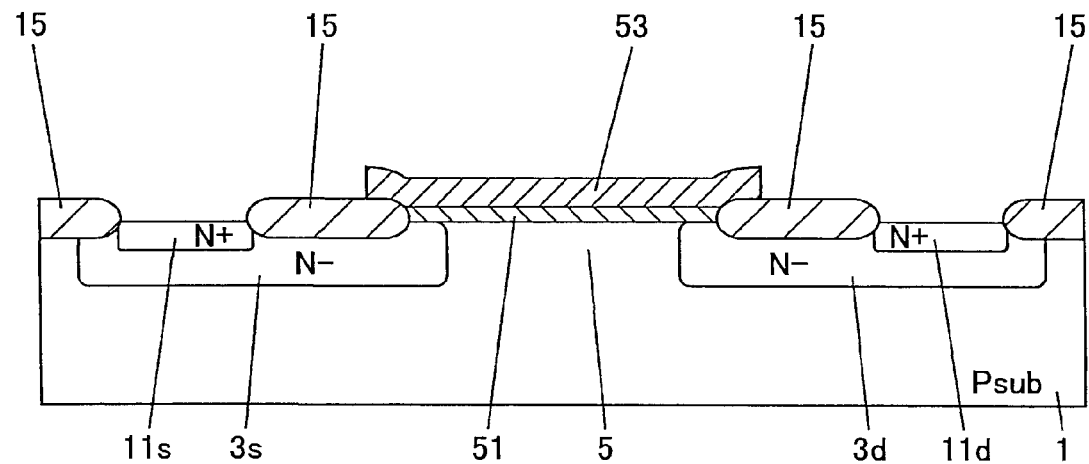
FIG. 36 shows a cross section of a subsequent step of the manufacturing process.
Figure 37:
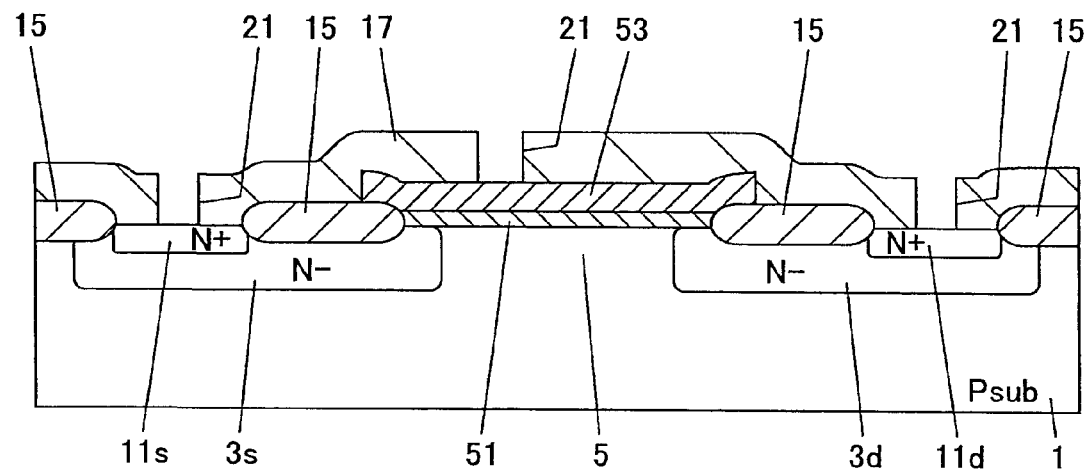
FIG. 37 shows a cross section of a subsequent step of the manufacturing process.
Figure 38:
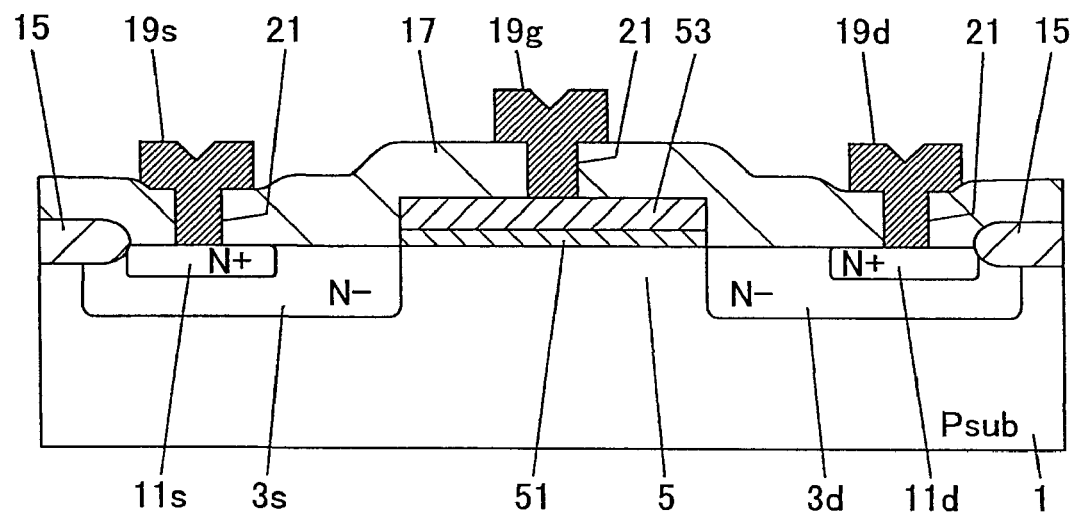
FIG. 38 schematically shows a cross section of a masked-LDD transistor.
Figure 39:
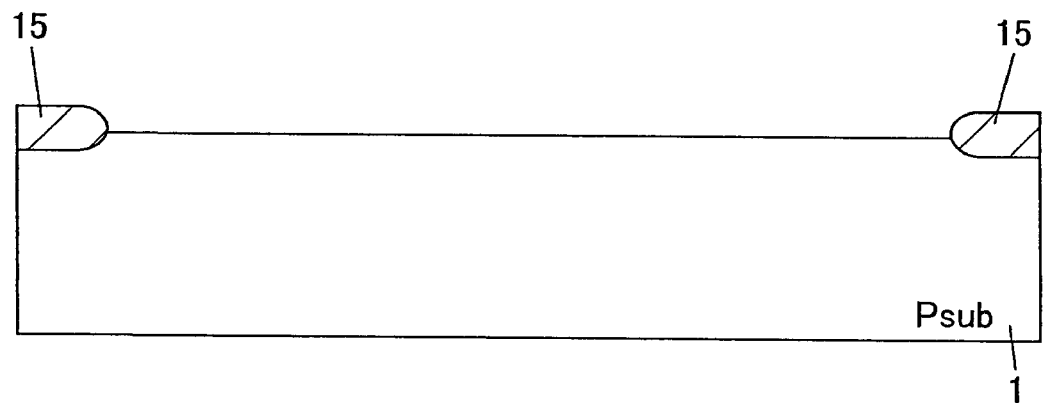
FIG. 39 shows a cross section illustrating an initial step of a process of manufacturing the masked-LDD transistor shown in FIG. 38.
Figure 40:
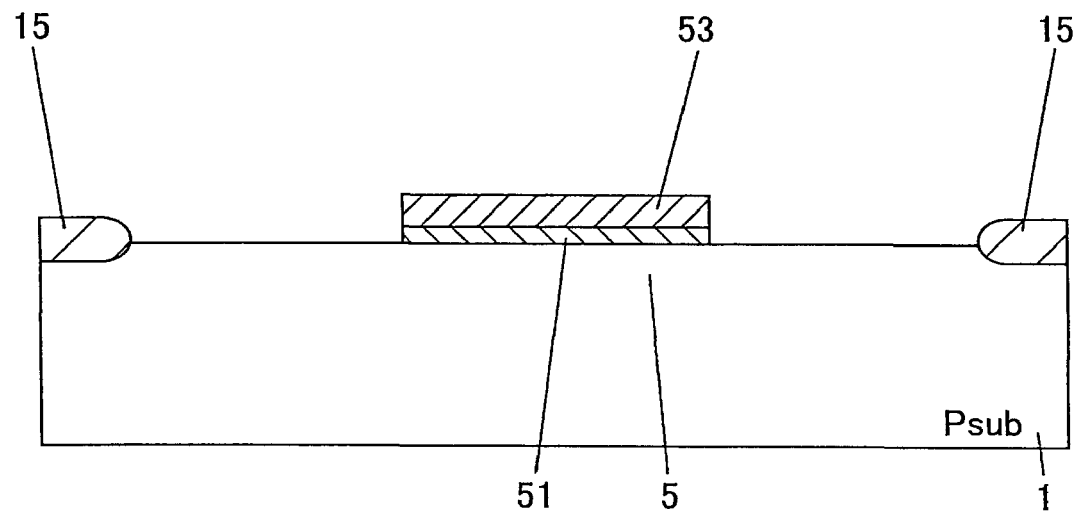
FIG. 40 shows a cross section illustrating a subsequent step of the manufacturing process.
Figure 41:
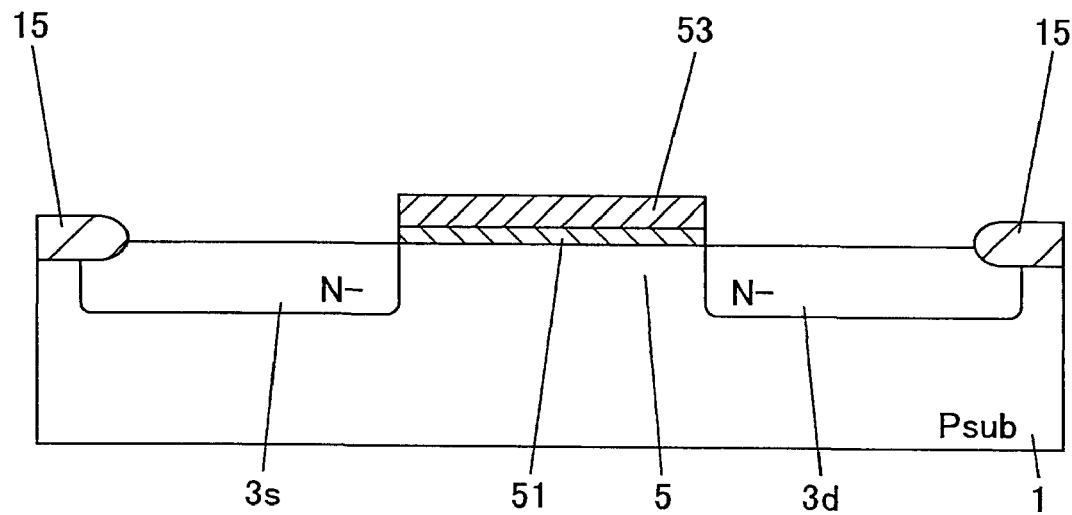
FIG. 41 shows a cross section of a subsequent step of the manufacturing process.
Figure 42:
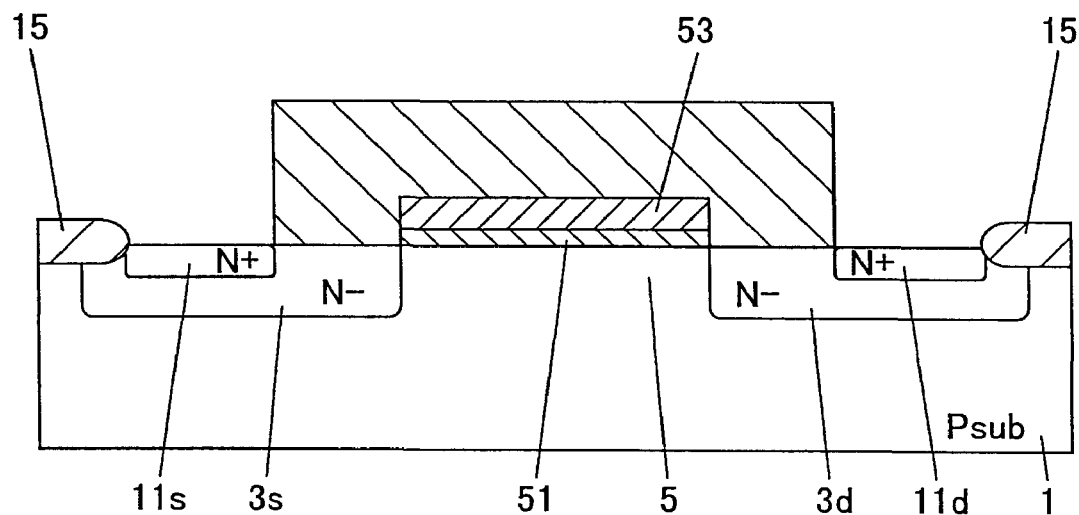
FIG. 42 shows a cross section of a subsequent step of the manufacturing process.
Figure 43:
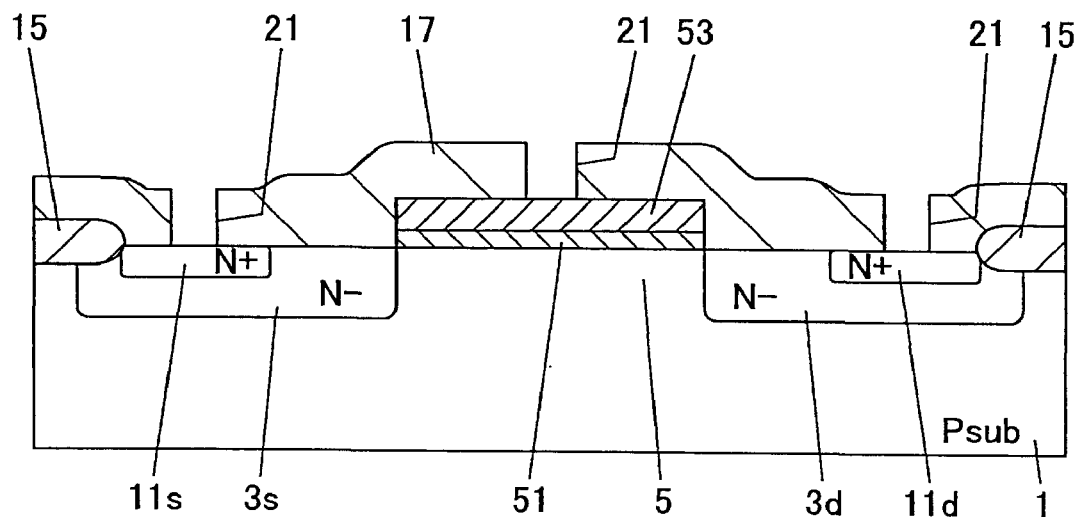
FIG. 43 shows a cross section of a subsequent step of the manufacturing process.
Figure 44:
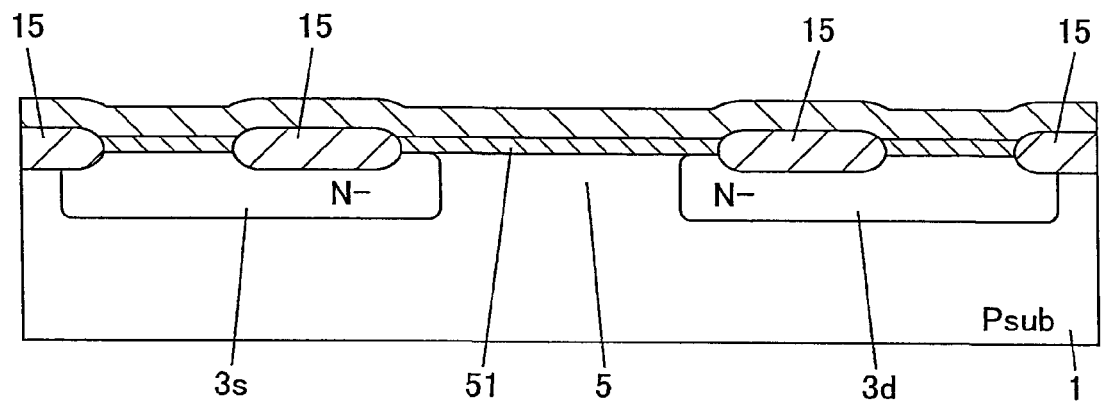
FIG. 44 shows a cross section for describing a problem that is encountered in a step of forming a LOCOS offset transistor having a thick gate insulating film.
Figure 45:
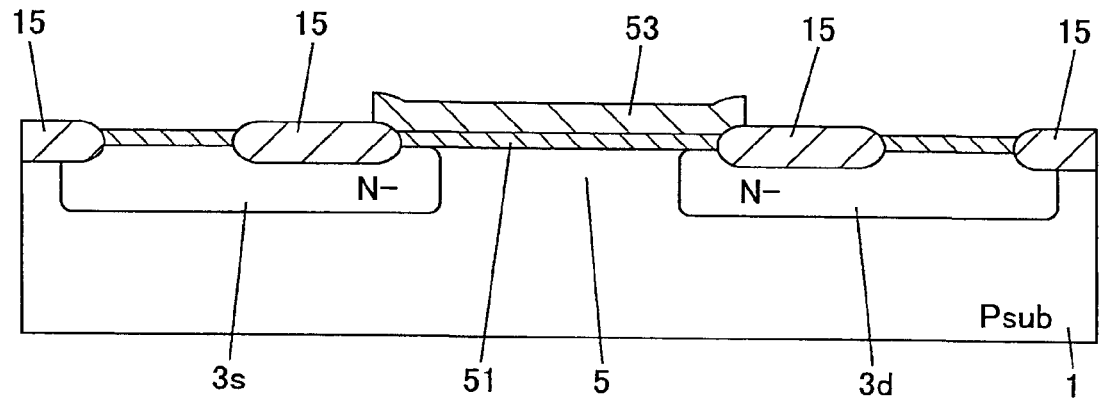
FIG. 45 shows a cross section illustrating a step subsequent to the step of FIG. 44.
Figure 46:
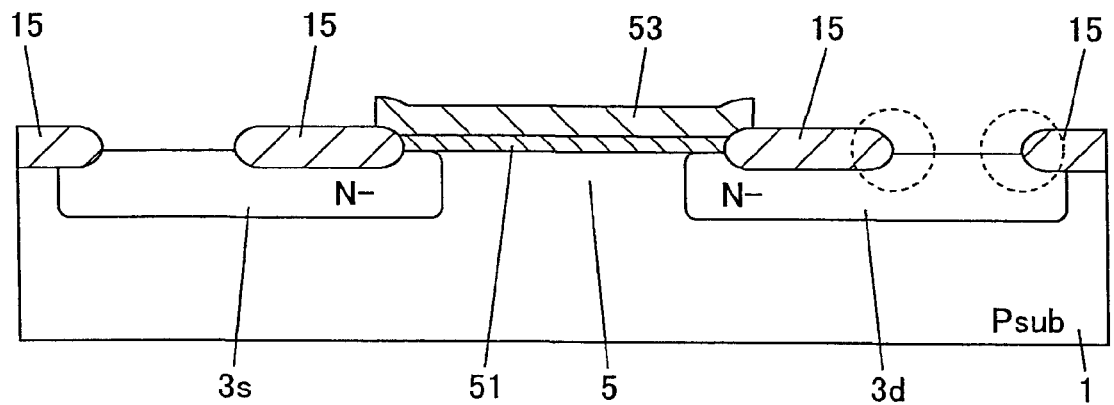
FIG. 46 shows a cross section illustrating a step subsequent to FIG. 45.

Then, the LOCOS oxide films 15 are formed by an existing isolation formation technique to a film thickness of 500 nm (see FIG. 27).

After the gate insulating film 7 is formed to a film thickness of 20 nm, a polycrystalline silicon film is successively deposited to a thickness of 300 nm. A resist pattern is then formed by a photomechanical technique and, using it as a mask, the polycrystalline silicon film and the gate insulating film 7 are successively removed by an anisotropic dry etching technique, whereby the first gate electrode 9 and the first capacitive element electrode 41u are formed of the polycrystalline silicon film and the gate insulating film 7 is formed under the first gate electrode 9. While the gate insulating film 7 remains under the first capacitive element electrode 41u, it is not shown. Thereafter, the resist pattern is removed (see FIG. 28).

After a silicon oxide film for forming the gate electrode insulating film 11 and the capacitive element electrode insulating film 43 is formed to a film thickness of 20 nm, a polycrystalline silicon film is successively deposited to a thickness of 300 nm. A resist pattern is then formed by a photomechanical technique and, using it as a mask, the polycrystalline silicon film and the silicon oxide film are successively removed by an anisotropic dry etching technique, whereby the second gate electrode 13 and the gate electrode insulating film 11 are formed over the first gate electrode 9, and the second capacitive element electrode 41t and the capacitive element electrode insulating film 43 are formed over the first capacitive element electrode 41u. A polycrystalline silicon processing residue 23 (see FIG. 10) may be formed but not shown at the sides of the first gate electrode 9 and the first capacitive element electrode 41u. Any polycrystalline silicon processing residue 23 that may be formed at the sides of the first capacitive element electrode 41u is formed over the LOCOS oxide film 15 and therefore does not adversely affect the electric characteristics of the capacitive element. Thereafter, the resist pattern is removed (see FIG. 29).

After a resist pattern having openings in regions for forming the LOCOS offset transistor is formed, arsenic is ion-implanted under the conditions of an implantation energy of 30 KeV and a dose of $5.0 \times 10^{15}$ cm$^{-2}$. Thereafter, the resist pattern is removed and the substrate is exposed to a nitrogen atmosphere at 900° C. for 30 minutes, whereby the implanted arsenic is diffused and activated, forming the N+ drain region 11d and the N+ source region 11s of high concentration (see FIG. 30).

Over the entire surface of the semiconductor substrate 1, a silicon oxide insulating film 17, such as a laminate film of an NSG film and a BPSG film, is deposited to a film thickness of 1000 nm. After a resist pattern is formed, the silicon oxide insulating film 17 at predetermined positions thereof is removed by etching, using the resist pattern as a mask, whereby connection holes 21 are formed at positions corresponding to the N+ drain region 11d, the N+ source region 11s, the second gate electrode 13, the first capacitive element electrode 41u, and the second capacitive element electrode 41t (see FIG. 31).

An aluminum metal film, for example, is formed over the silicon oxide insulating film 17 and then patterned, so as to form the gate wiring 19g, the drain wiring 19d, source wiring 19s, the first capacitive element electrode wiring 45u, and the second capacitive element electrode wiring 45 (see FIG. 25).

In the present embodiment, the capacitive element comprises the first capacitive element electrode 41u formed of the same material as and simultaneously with the first gate electrode 9, the capacitive element electrode insulating film 43 formed of the same material as and simultaneously with the gate electrode insulating film 11, and the second capacitive element electrode 41t formed of the same material as and simultaneously with the second gate electrode 13. Thus, the capacitive element can be formed on the same semiconductor substrate 1 in a hybrid manner without increasing the number of steps in the LOCOS offset transistor manufacturing process.

While in the present embodiment the edges of the second capacitive element electrode 41t are disposed within the edges of the first capacitive element electrode 41u as seen from above, the layout of the first capacitive element electrode 41u and the second capacitive element electrode 41t is not limited by such an embodiment.

For example, as in the layout of the first gate electrode 9 and the second gate electrode 13 of the LOCOS offset transistor shown in FIG. 12 or FIG. 14 as regards the capacitive element, the edges of the second capacitive element electrode 41t as seen from above may be disposed outside the edges of the first capacitive element electrode 41u, such that the second capacitive element electrode 41t is not formed at the position where a contact for the first capacitive element electrode 41u is formed. In this way, the formation of the polycrystalline silicon processing residue 23 (see FIG. 10) at the sides of the first capacitive element electrode 41u can be prevented.

Alternatively, as in the layout of the first gate electrode 9 and the second gate electrode 13 of the LOCOS offset transistor shown in FIG. 13 as regards the capacitive element, the edges of the second capacitive element electrode 41t as seen from above may be partly disposed outside the edges of the first capacitive element electrode 41u.

While the present invention has been described above with reference to particular embodiments, the shapes, arrangements, numbers, or materials used in these embodiments are exemplary. Various changes or modifications may be made within the scope of the invention recited in the claims.

The present application is based on the Japanese Priority Application No. 2007-085868 filed Mar. 28, 2007, the entire contents of which are hereby incorporated by reference.

The invention claimed is:

1. A semiconductor device comprising a MOS transistor which comprises:
    a semiconductor substrate of a first conductivity type;
    a drain region and a source region both of a second conductivity type disposed spaced apart from each other on a surface of the semiconductor substrate,
    a gate insulating film formed on the semiconductor substrate between the source region and the drain region; and
    a gate electrode formed on the gate insulating film;
    wherein the semiconductor substrate between the source region and the drain region provides a channel region,
    the drain region comprising a first drain region disposed spaced apart from the gate insulating film and the channel region, and a second drain region disposed between and adjacent to the first drain region and the channel region,
    wherein the gate electrode comprises a first gate electrode formed on the gate insulating film and a second gate electrode formed on the first gate electrode via a gate electrode insulating film,
    wherein a gate wiring for providing a gate voltage is connected to the second gate electrode but not to the first gate electrode,
    wherein, as seen from above, the edges of the second gate electrode are partly or entirely disposed outside the edges of the first gate electrode, wherein a portion of the second gate electrode that is disposed outside the edges of the first gate electrode is disposed over the field insulating film, the portion being disposed over the first gate electrode via the gate electrode insulating film.

2. The semiconductor device according to claim 1, wherein, as seen from above, an edge of the second gate electrode is disposed over the first gate electrode alone.

3. The semiconductor device according to claim 2, comprising a pattern covering an edge and a side of the first gate electrode and disposed spaced apart from the second gate electrode, wherein the pattern is formed of the same material as and simultaneously with the second gate electrode.

4. The semiconductor device according to claim 1, wherein, as seen from above, all of the edges of the second gate electrode are disposed outside the edges of the first gate electrode, covering the edges and sides of the first gate electrode.

5. The semiconductor device according to claim 4, wherein, as seen from above, there is a region over the first gate electrode that is spaced apart from the edges of the first gate electrode and where the second gate electrode is not formed.

6. The semiconductor device according to claim 1, comprising a plurality of the MOS transistors having different capacitance values between the first gate electrode and the second gate electrode.

7. The semiconductor device according to claim 6, wherein the plural MOS transistors differ from each other only in terms of the layout area of the second gate electrode.

8. The semiconductor device according to claim 6, further comprising a capacitive element which comprises:
- a first capacitive element electrode formed on the semiconductor substrate of the same material as and simultaneously with the first gate electrode; and
- a second capacitive element electrode formed on the first capacitive element electrode of the same material as and simultaneously with the second gate electrode, via an insulating film.

9. A semiconductor device comprising a MOS transistor which comprises:
- a semiconductor substrate of a first conductivity type;
- a drain region and a source region both of a second conductivity type disposed spaced apart from each other on a surface of the semiconductor substrate,
- a gate insulating film formed on the semiconductor substrate between the source region and the drain region; and
- a gate electrode formed on the gate insulating film;
- wherein the semiconductor substrate between the source region and the drain region provides a channel region,
- the drain region comprising a first drain region disposed spaced apart from the gate insulating film and the channel region, and a second drain region disposed between and adjacent to the first drain region and the channel region,
- wherein the gate electrode comprises a first gate electrode formed on the gate insulating film and a second gate electrode formed on the first gate electrode via a gate electrode insulating film,
- wherein a gate wiring for providing a gate voltage is connected to the second gate electrode but not to the first gate electrode, and
- wherein the semiconductor device further comprises a capacitive element which comprises:
  - a first capacitive element electrode formed on the semiconductor substrate of the same material as and simultaneously with the first gate electrode; and
  - a second capacitive element electrode formed on the first capacitive element electrode of the same material as and simultaneously with the second gate electrode, via an insulating film.

10. The semiconductor device according to claim 9, wherein, as seen from above, an edge of the second gate electrode is disposed over the first gate electrode alone.

11. The semiconductor device according to claim 10, comprising a pattern covering an edge and a side of the first gate electrode and disposed spaced apart from the second gate electrode, wherein the pattern is formed of the same material as and simultaneously with the second gate electrode.

12. The semiconductor device according to claim 9, further comprising a plurality of the MOS transistors having different capacitance values between the first gate electrode and the second gate electrode.

13. The semiconductor device according to claim 12, wherein the plural MOS transistors differ from each other only in terms of the layout area of the second gate electrode.

* * * * *